US007829426B2

(12) United States Patent
Burke et al.

(10) Patent No.: US 7,829,426 B2
(45) Date of Patent: Nov. 9, 2010

(54) SEMICONDUCTOR COMPONENT AND METHOD OF MANUFACTURE

(75) Inventors: Peter A. Burke, Portland, OR (US); Sallie Hose, Gresham, OR (US); Sudhama C. Shastri, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 12/549,100

(22) Filed: Aug. 27, 2009

(65) Prior Publication Data

US 2009/0315142 A1 Dec. 24, 2009

(51) Int. Cl.
*H01L 21/02* (2006.01)

(52) U.S. Cl. ........................ 438/381; 438/329; 438/171; 257/528; 257/E27.024; 257/E21.003

(58) Field of Classification Search ................. 438/171, 438/329, 381; 257/528, E27.024, E21.003
See application file for complete search history.

(56) References Cited

U.S. PATENT DOCUMENTS 5,611,008 A * 3/1997 Yap ............................. 385/14

* cited by examiner

*Primary Examiner*—Victor A Mandala
(74) *Attorney, Agent, or Firm*—Rennie William Dover

(57) ABSTRACT

A semiconductor component that includes an integrated passive device and method for manufacturing the semiconductor component. Vertically integrated passive devices are manufactured above a substrate. In accordance with one embodiment, a resistor is manufactured in a first level above a substrate, a capacitor is manufactured in a second level that is vertically above the first level, and a copper inductor is manufactured in a third level that is vertically above the second level. The capacitor has aluminum plates. In accordance with another embodiment, a resistor is manufactured in a first level above a substrate, a copper inductor is manufactured in a second level that is vertically above the first level, and a capacitor is manufactured in a third level that is vertically above the second level. The capacitor may have aluminum plates or a portion of the copper inductor may serve as one of its plates.

13 Claims, 34 Drawing Sheets

300

300

300

SEMICONDUCTOR COMPONENT AND METHOD OF MANUFACTURE

The present application is based on prior U.S. application Ser. No. 11/618363 filed on Dec. 29, 2006 which is hereby incorporated by reference, and priority thereto for common subject matter is hereby claimed.

FIELD OF THE INVENTION

The present invention relates, in general, to semiconductor components and, more particularly, to semiconductor components that include one or more passive circuit elements.

BACKGROUND OF THE INVENTION

Semiconductor component manufacturers are constantly striving to increase the functionality and performance of their products, while decreasing their cost of manufacture. One approach for increasing functionality and performance has been to increase the number of circuit elements manufactured from a semiconductor wafer. As those skilled in the art are aware, a semiconductor wafer is divided into a plurality of areas or regions called chips or dice. Identical circuit elements are manufactured in each chip. Increasing the number of chips in a semiconductor wafer lowers the cost of manufacturing semiconductor components. However, a drawback with integrating a larger number of circuit elements in a semiconductor wafer is that it increases the area occupied by each chip and thereby decreases the number of chips that can be manufactured from a single semiconductor wafer. Integrating passive circuit elements with active circuit elements further increases the chip size because they occupy a larger area than active devices. Thus, in lowering manufacturing costs semiconductor component manufacturers trade-off the number of circuit elements that can be manufactured in a chip with the number of chips that can be obtained from a semiconductor wafer.

Another drawback with monolithically integrating passive and active circuit elements in a semiconductor chip is that the tools for manufacturing passive circuit elements are optimized for manufacturing larger geometry devices whereas the tools for manufacturing active circuit elements are optimized for manufacturing smaller geometry devices. For example, equipment used in the manufacture of passive circuit elements is precise to within a tenth of a micron whereas equipment used for manufacturing active circuit elements is precise to within a thousandth of a micron.

Thus, it would be advantageous to have a method for manufacturing passive and active circuit elements in a semiconductor chip that is area and cost efficient. It would be of further advantage to be able to use common equipment or toolsets for manufacturing passive and active circuit elements.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
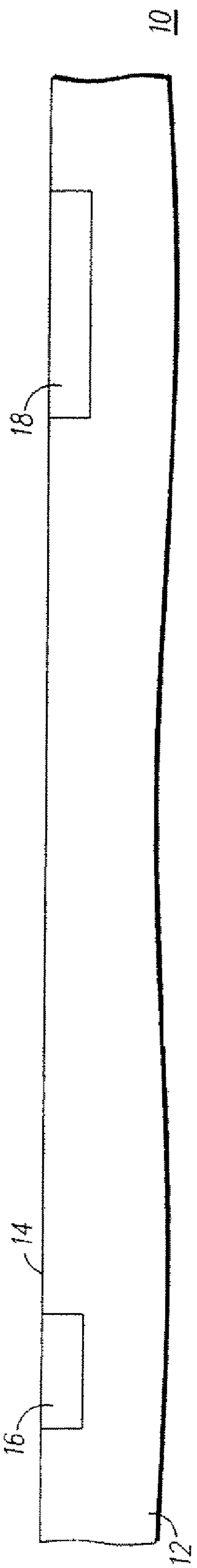
FIG. 1 is a cross-sectional view of a semiconductor component at a beginning stage of manufacture in accordance with an embodiment of the present invention.

Generally, the present invention provides vertically integrated passive and active devices and a method for manufacturing the vertically integrated passive and active devices. In accordance with one embodiment, a resistor, a Metal-Insulator-Metal ("MIM") capacitor, an inductor, and an active device are manufactured as a monolithic integrated circuit. It should be noted that inductors and capacitors are also referred to as energy storage elements or devices. The resistor is manufactured in a first device or circuit element level. The resistor may be a precision resistor that is made of a metal or other resistive material. The MIM capacitor is manufactured in a second device or circuit element level where the second circuit element level is in a plane that is above that of the first circuit element level. The two plates of the MIM capacitor are preferably comprised of aluminum. The inductor is manufactured in a third device or circuit element level using a copper damascene process where the third device or circuit element level is in a plane that is above the second circuit element level. Thus, integrated passive devices are manufactured using a single and dual damascene processes which allows their integration into high performance semiconductor manufacturing processes. Using the damascene process to form the inductor allows fabricating it with an aspect ratio greater than about 0.7:1 to 5:1 and with linewidths that are less than about 3.5 micrometers. It should be noted that the aspect ratio is the ratio of the height of the inductor to its width. In addition, the integrated passive devices may be manufactured over active devices, further reducing the area occupied by the devices.

In accordance with another embodiment, a passivation layer is formed over the copper inductor of the first embodiment and over a copper interconnect layer. An opening is formed in the passivation layer to expose the copper of the interconnect layer, the copper of the inductor, or the copper of both the interconnect layer and the inductor. Aluminum is formed over the copper. Forming aluminum over the copper in accordance with this embodiment overcomes the difficulty with passivating copper. Thus, the present invention allows vertically integrating passive circuit elements that are made from copper and packaging the circuit elements using silicon wafer packaging techniques. For example, wirebonds or bumps can be made to the aluminum that is over the copper.

In accordance with another embodiment, the resistor is in the first circuit element level, the inductor is in the second circuit element level, and the MIM capacitor is manufactured in the third circuit element level. The inductor can be manufactured using a single or a dual damascene process. In accordance with this embodiment, an aluminum layer is formed in electrical contact with the copper, wherein the aluminum layer forms one plate of an MIM capacitor.

In accordance with another embodiment, the resistor is in the first circuit element level, the inductor is in the second circuit element level, and the MIM capacitor is manufactured in the third circuit element level. The inductor can be manufactured using a single or a dual damascene process. In accordance with this embodiment, a portion of the inductor forms one of the plates of a MIM capacitor. The capacitance value of the MIM capacitor is set by exposing a predetermined portion or size of the inductor. The dielectric material for the MIM capacitor is formed on the exposed portion of the copper inductor.

It should be noted that the circuit levels are also referred to as vertical planar regions, wherein one vertical planar region is either above or below another vertical planar region.

FIG. 1 is a cross-sectional side view of a portion of a semiconductor component 10 during manufacture in accordance with an embodiment of the present invention. What is shown in FIG. 1 is a substrate 12 having a major surface 14. An active device 16 and a passive device 18 are formed from substrate 12. Techniques for forming active devices in or on substrate 12 are known to those skilled in the art. Active device 16 may be a diode, a Zener diode, a field effect transistor, a bipolar transistor, or the like, and passive device 18 may be a resistor, a capacitor, an inductor, or the like. Although only a single active device and a single passive device have been described, it should be understood that one or more active and passive devices may be formed from substrate 12. Alternatively, substrate 12 may be devoid of active devices, passive devices, or active and passive devices. In accordance with one embodiment, substrate 12 is silicon doped with an impurity material of P-type conductivity such as, for example, boron. By way of example, the resistivity of substrate 12 ranges from about 0.001 Ohm-centimeters (Ω-cm) to about 10,000 Ω-cm. Although substrate 12 may be a high resistivity substrate, the resistivity or dopant concentration of substrate 12 is not a limitation of the present invention. Likewise, the type of material for substrate 12 is not limited to being silicon and the conductivity type of substrate 12 is not limited to being P-type conductivity. It should be understood that an impurity material is also referred to as a dopant or impurity species. Other suitable materials for substrate 12 include polysilicon, germanium, silicon germanium, Semiconductor-On-Insulator ("SOI") material, and the like. In addition, substrate 12 can be comprised of a compound semiconductor material such as Group III-V semiconductor materials, Group II-VI semiconductor materials, etc.

Figure 2:
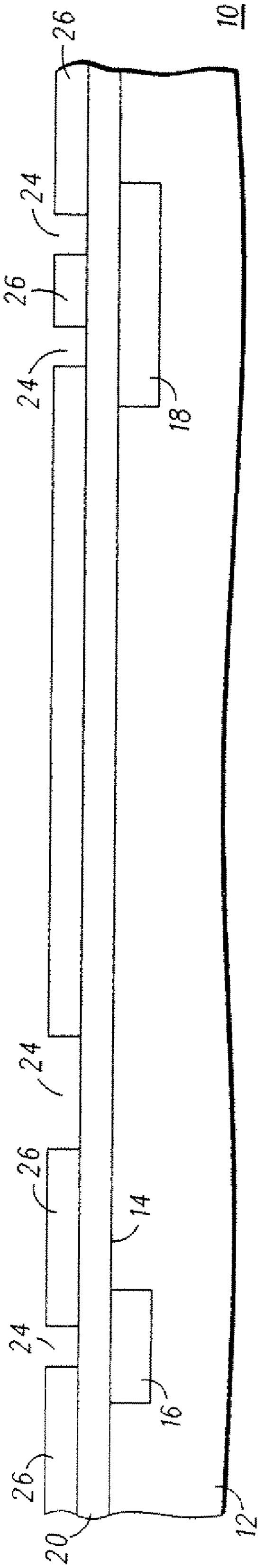
FIG. 2 is a cross-sectional view of the semiconductor component of FIG. 1 at a later stage of manufacture.

Referring now to FIG. 2, a layer of dielectric material 20 having a thickness ranging from about 1,000 Angstroms (Å) to about 60,000 Å is formed on surface 14. In accordance with one embodiment, dielectric material 20 is formed by the decomposition of tetraethylorthosilicate ("TEOS") to form an oxide layer having a thickness of about 8,000 Å. A dielectric layer formed in this manner is typically referred to as TEOS. The type of material for dielectric layer 20 is not a limitation of the present invention. A layer of photoresist is formed on TEOS layer 20 and patterned to have openings 24 that expose portions of TEOS layer 20. The remaining portions of the photoresist layer serve as a masking structure 26.

Figure 3:
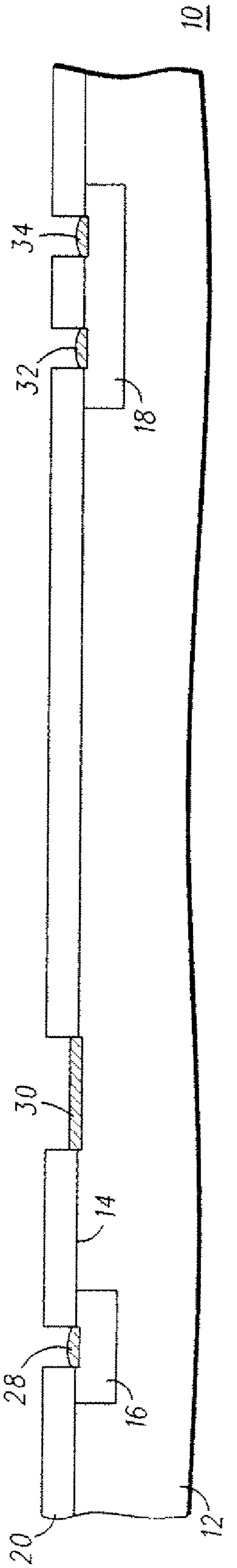
FIG. 3 is a cross-sectional view of the semiconductor component of FIG. 2 at a later stage of manufacture.

Referring now to FIG. 3, openings are formed in the exposed portions of dielectric layer 20 using, for example, an anisotropic reactive ion etch. The openings expose portions of active device 16, passive device 18, and substrate 12. A layer of refractory metal (not shown) is conformally deposited over the exposed portions of active device 16, passive device 18, substrate 12, and over dielectric layer 20. By way of example, the refractory metal is nickel, having a thickness ranging from about 50 Å to about 150 Å. The refractory metal is heated to a temperature ranging from about 350 degrees Celsius (° C.) to about 500° C. The heat treatment causes the nickel to react with the silicon to form nickel silicide (NiSi) in all regions in which the nickel is in contact with silicon. Thus, a nickel silicide region 28 is formed from active device 16, a nickel silicide region 30 is formed from substrate 12, and nickel silicide regions 32 and 34 are formed from passive device 18. The portions of the nickel over dielectric layer 20 remain unreacted. After formation of the nickel silicide regions, any unreacted nickel is removed. It should be understood that the type of silicide is not a limitation of the present invention. For example, other suitable silicides include titanium silicide (TiSi), platinum silicide (PtSi), cobalt silicide ($CoSi_2$), or the like. As those skilled in the art are aware, silicon is consumed during the formation of silicide and the amount of silicon consumed is a function of the type of silicide being formed.

In accordance with one embodiment, passive device 18 is a resistor and silicide region 30 serves as a ground contact. Masking structure 26 is removed.

Figure 4:
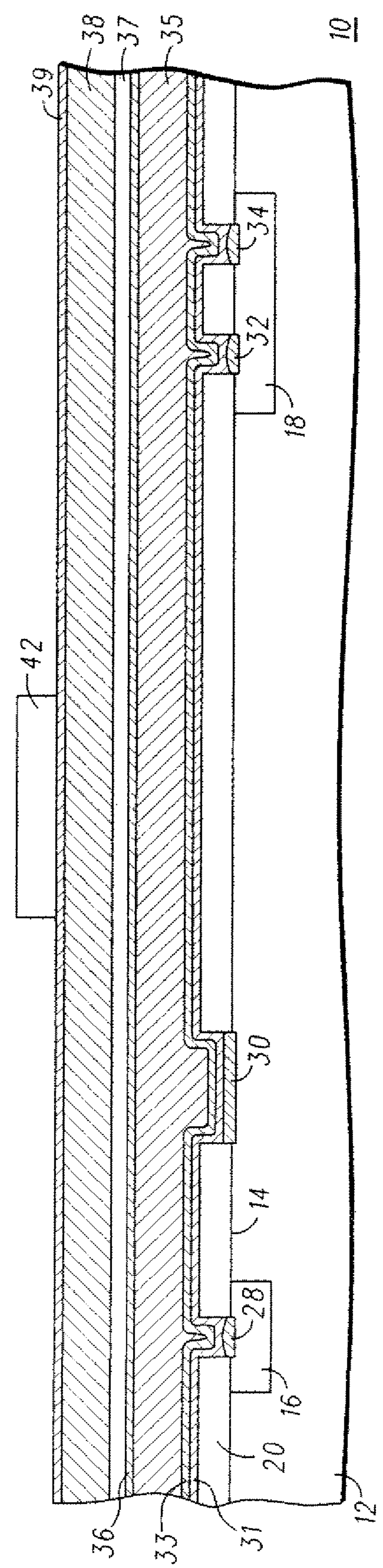
FIG. 4 is a cross-sectional view of the semiconductor component of FIG. 3 at a later stage of manufacture.

Referring now to FIG. 4, a layer of titanium 31 having a thickness ranging from about 25 Å to about 200 Å is formed on dielectric layer 20 and in the openings formed in dielectric layer 20. A layer of titanium nitride 33 having a thickness ranging from about 75 Å to about 600 Å is formed on titanium layer 31. A layer of aluminum 35 having thickness ranging from about 5,000 Å to about 40,000 Å is formed on titanium nitride layer 33. By way of example aluminum layer 35 has a thickness of about 20,000 Å. A layer of titanium nitride 36 having a thickness ranging from about 400 Å to about 900 Å is formed on aluminum layer 35. Layers 31, 33, 35, and 36 may be formed using Chemical Vapor Deposition ("CVD"), Plasma Enhanced Chemical Vapor Deposition ("PECVD"), sputtering, evaporation, or the like. It should be understood that the materials of layers 31, 33, 36 are not limitations of the present invention. Other suitable materials for layer 31 include tantalum, tungsten, platinum, a refractory metal compound, a refractory metal carbide, a refractory metal boride, or the like and other suitable materials for layers 33 and 36 include, tantalum nitride, a metal nitride doped with carbon, a metal nitride doped with silicon, or the like. A layer of dielectric material 37 having thickness ranging from about 400 Å to about 2,500 Å is formed above titanium nitride layer 36. Suitable dielectric materials for layer 37 include silicon nitride, silicon dioxide, and dielectric materials having a high dielectric constant, i.e., a dielectric constant greater than 3.9, materials having a low dielectric constant, etc. A layer of aluminum 38 having thickness ranging from about 500 Å to about 4,000 Å is formed on dielectric layer 37. A layer of titanium nitride 39 having thickness ranging from about 600 Å to about 1,200 Å is formed on aluminum layer 38. A layer of photoresist is formed on titanium nitride layer 39 and patterned to have openings that expose portions of titanium nitride layer 39. The remaining portions of the photoresist layer serve as a masking structure 42.

Figure 5:
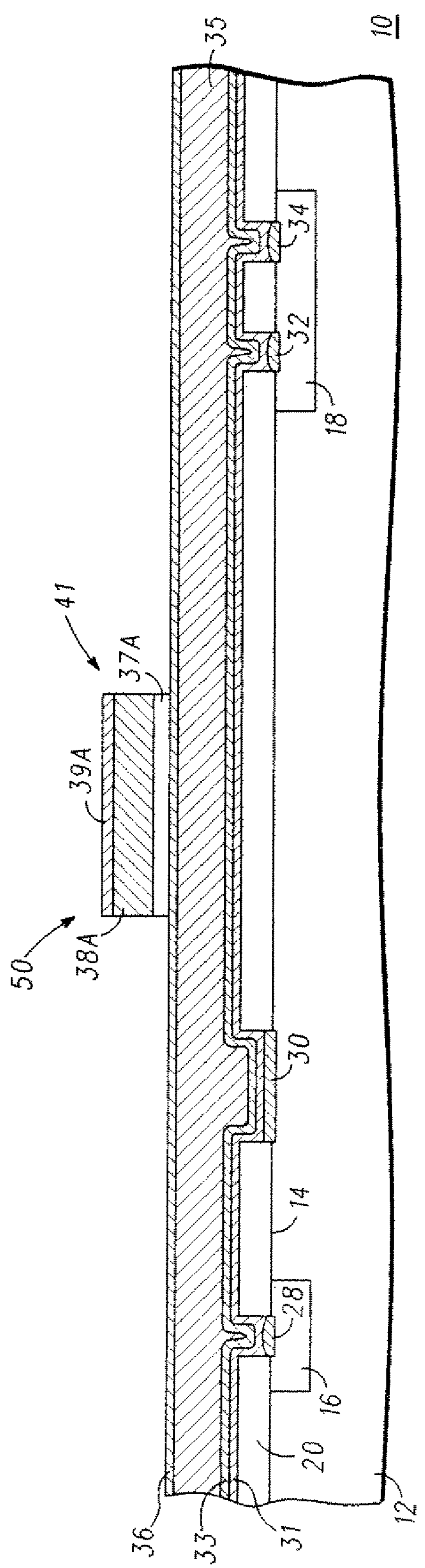
FIG. 5 is a cross-sectional view of the semiconductor component of FIG. 4 at a later stage of manufacture.

Referring now to FIG. 5, the exposed portions of titanium nitride layer 39 and portions of aluminum layer 38 that are under the exposed portions of titanium nitride layer 39 are anisotropically etched using, for example, a reactive ion etch. Dielectric layer 37 serves as an etch stop layer. Thus, etching aluminum layer 38 exposes portions of dielectric layer 37. The exposed portions of dielectric layer 37 are anisotropically etched using titanium nitride layer 36 as an etch stop layer. Portions 39A, 38A, and 37A of titanium nitride layer 39, aluminum layer 38, and dielectric layer 37 remain after the anisotropic etch. Portion 37A serves as a dielectric layer of a Metal-Insulator-Metal ("MIM") capacitor 50 and portions 38A and 39A cooperate to form a conductor 41 of MIM capacitor 50, i.e., conductor 41 serves as one plate of MIM capacitor 50. A portion of aluminum layer 35 serves as the other plate of MIM capacitor 50. This plate is further discussed with reference to FIG. 7. Masking structure 42 is removed.

Figure 6:
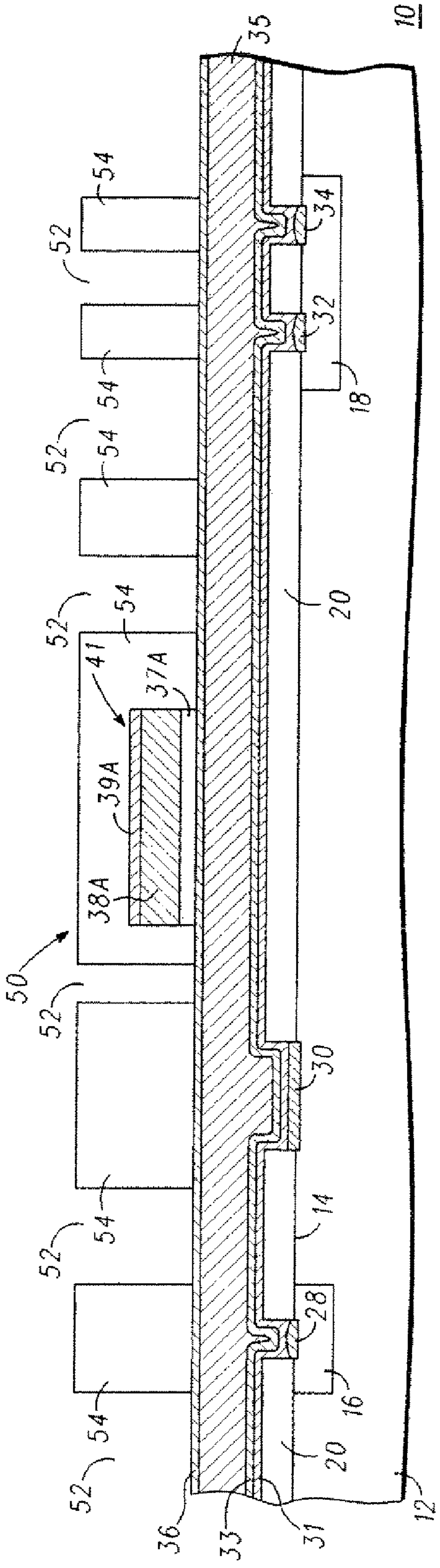
FIG. 6 is a cross-sectional view of the semiconductor component of FIG. 5 at a later stage of manufacture.

Referring now to FIG. 6, a layer of photoresist is formed on silicon nitride layer 37 and on portion 39A of silicon nitride layer 37. The layer of phototresist is patterned to have openings 52 that expose portions of titanium nitride layer 36. The remaining portions of the photoresist layer serve as a masking structure 54.

Figure 7:
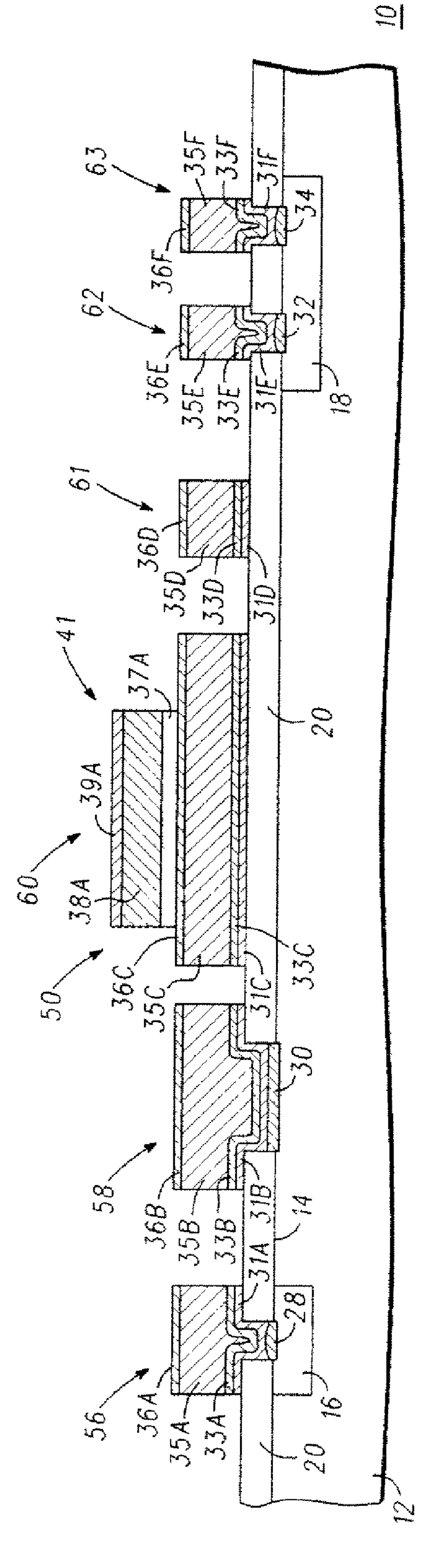
FIG. 7 is a cross-sectional view of the semiconductor component of FIG. 6 at a later stage of manufacture.

Referring now to FIG. 7, the exposed portions of titanium nitride layer 36 and the portions of layers 35, 33, and 31 under the exposed portions of titanium nitride layer 36 are anisotropically etched using, for example, a reactive ion etch. Dielectric layer 20 serves as an etch stop layer. Portions 35A, 35B, 35C, 35D, 35E, and 35F of aluminum layer 35, portions 36A, 36B, 36C, 36D, 36E, and 36F of titanium nitride layer 36, portions 33A, 33B, 33C, 33D, 33E, and 33F of titanium nitride layer 33, and portions 31A, 31B, 31C, 31D, 31E, and 31F of titanium layer 31 remain after the anisotropic etch. Portions 31A, 33A, 35A, and 36A cooperate to form a conductor 56; portions 31B, 33B, 35B, and 36B cooperate to form a conductor 58, portions 31C, 33C, 35C, and 36C cooperate to form a conductor 60, portions 31D, 33D, 35D, and 36D cooperate to form a conductor 61; portions 31E, 33E, 35E, and 36E cooperate to form a conductor 62; and portions 31F, 33F, 35F, and 36F cooperate to form a conductor 63. Conductors 56 and 58 serve as conductors for active device 16 and ground contact 32, respectively, and conductor 60 serves as the other plate of MIM capacitor 50. Conductors 62 and 63 serve as conductors for passive device 18.

Figure 8:
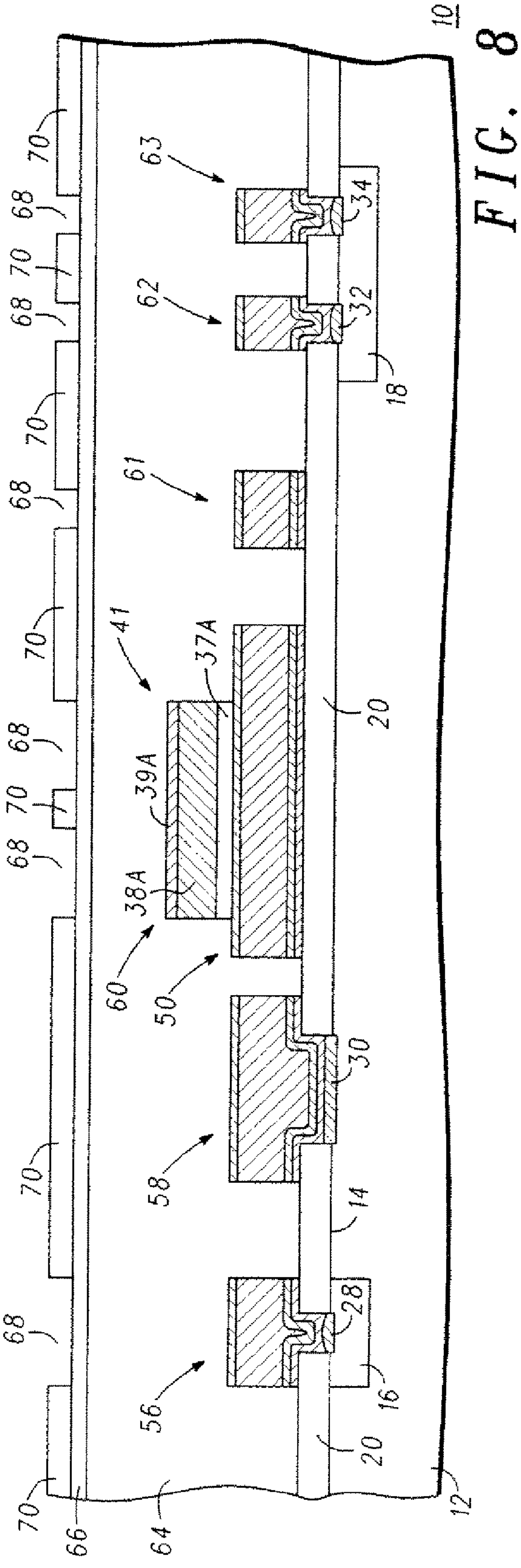
FIG. 8 is a cross-sectional view of the semiconductor component of FIG. 7 at a later stage of manufacture.

Referring now to FIG. 8, a layer of dielectric material 64 is formed. TEOSIn accordance with one embodiment, dielectric material 64 is TEOS. The type of material for dielectric layer 64 is not a limitation of the present invention. Dielectric layer 64 is planarized using a planarization technique such as, for example, CMP, to have a thickness ranging from, for example, about 2,000 Å to about 25,000 Å above conductor 41, i.e., one of the plates of MIM capacitor 50. An etch stop layer 66 having a thickness ranging from about 500 Å to about 3,000 Å is formed on dielectric layer 64 Preferably, the dielectric material of etch stop layer 66 has a different etch selectivity than the dielectric material of dielectric layer 64. Suitable materials for etch stop layer 66 include silicon nitride, silicon carbide, silicon carbide nitride ("SiCN"), silicon carbide nitro-oxide ("SiCNO"), or the like. A layer of photoresist is formed on etch stop layer 66 and patterned to have openings 68 that expose portions of etch stop layer 66. The remaining portion of the photoresist layer serves as a masking structure 70.

Figure 9:
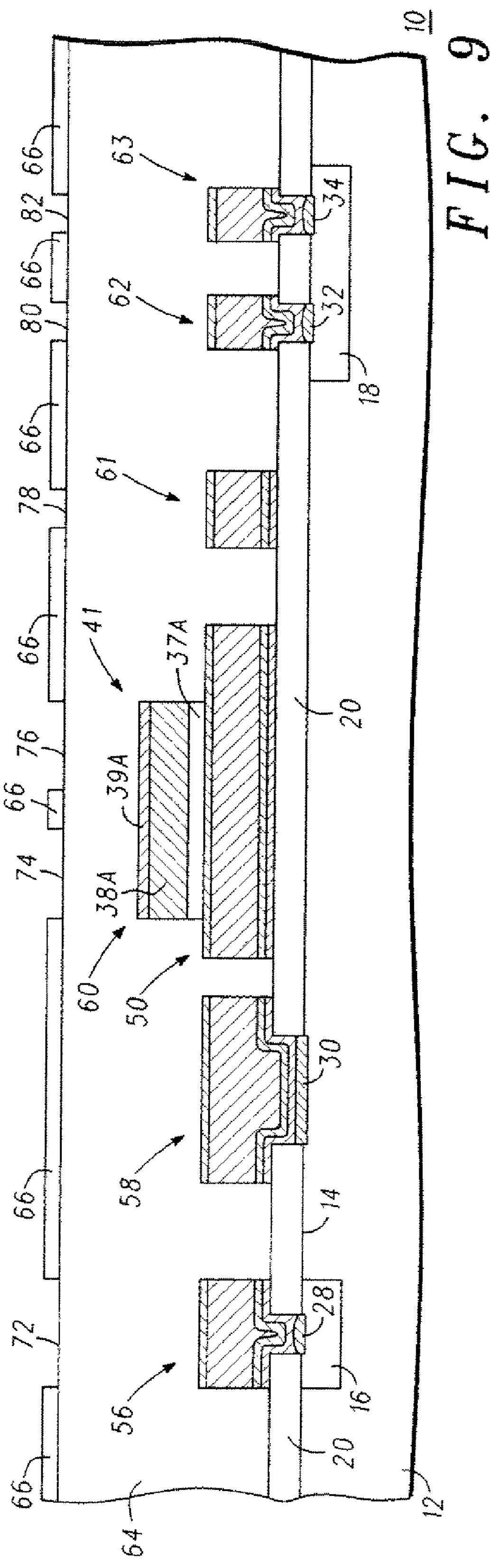
FIG. 9 is a cross-sectional view of the semiconductor component of FIG. 8 at a later stage of manufacture.

Referring now to FIG. 9, the exposed portions of etch stop layer 66 are anisotropically etched to expose portions 72, 74, 76, 78, 80, and 82 of dielectric layer 64. By way of example, etch stop layer 66 is etched using a reactive ion etch. Masking structure 70 is removed.

Figure 10:
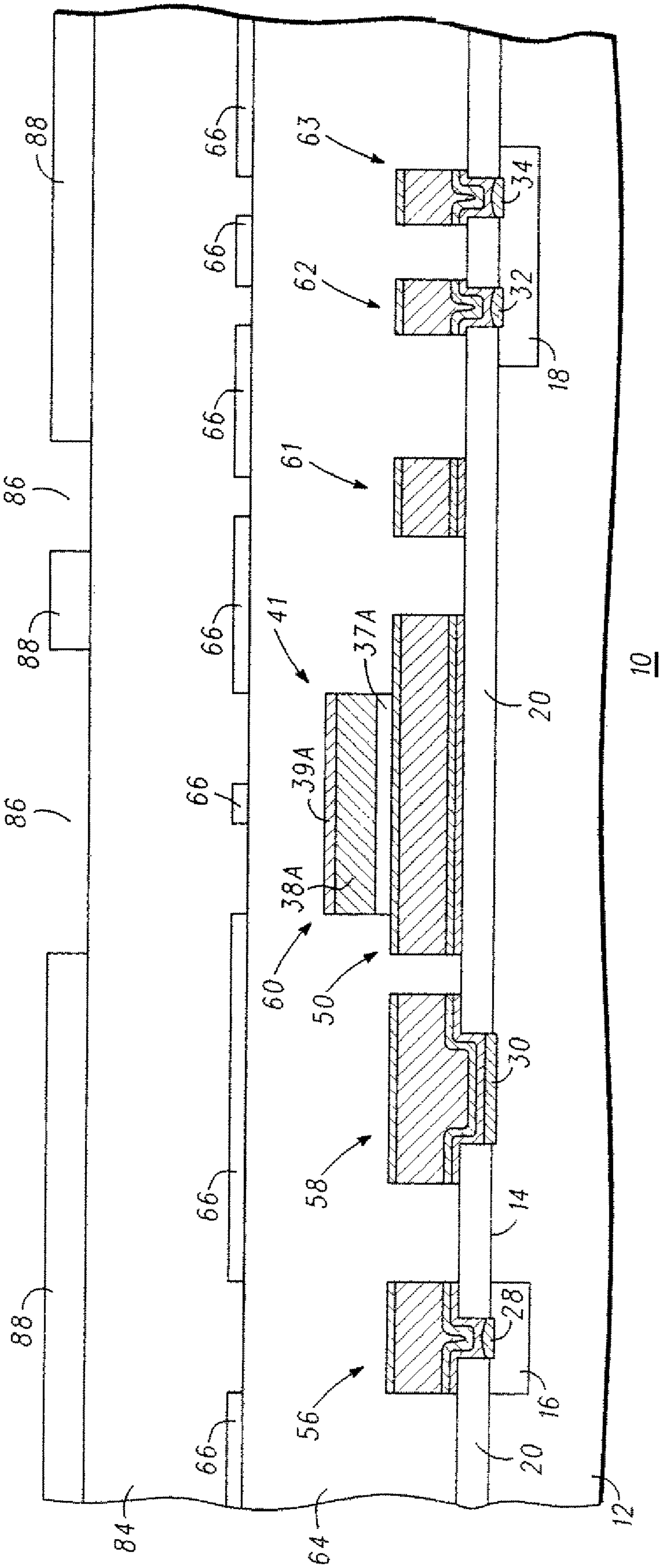
FIG. 10 is a cross-sectional view of the semiconductor component of FIG. 9 at a later stage of manufacture.

Referring now to FIG. 10, a layer of dielectric material 84 having a thickness ranging from about 10,000 Å to about 120,000 Å is formed on the exposed portions of etch stop layer 66 and the exposed portions of dielectric layer 64. In accordance with an embodiment of the present invention, dielectric material 84 is TEOS. The type of material for dielectric layer 84 is not a limitation of the present invention. Optionally, dielectric layer 84 can be planarized using a planarization technique such as, for example, CMP. A layer of photoresist is formed on dielectric layer 84 and patterned to have openings 86 that expose portions of dielectric layer 84. The remaining portion of the photoresist layer serves as a masking structure 88.

Figure 11:
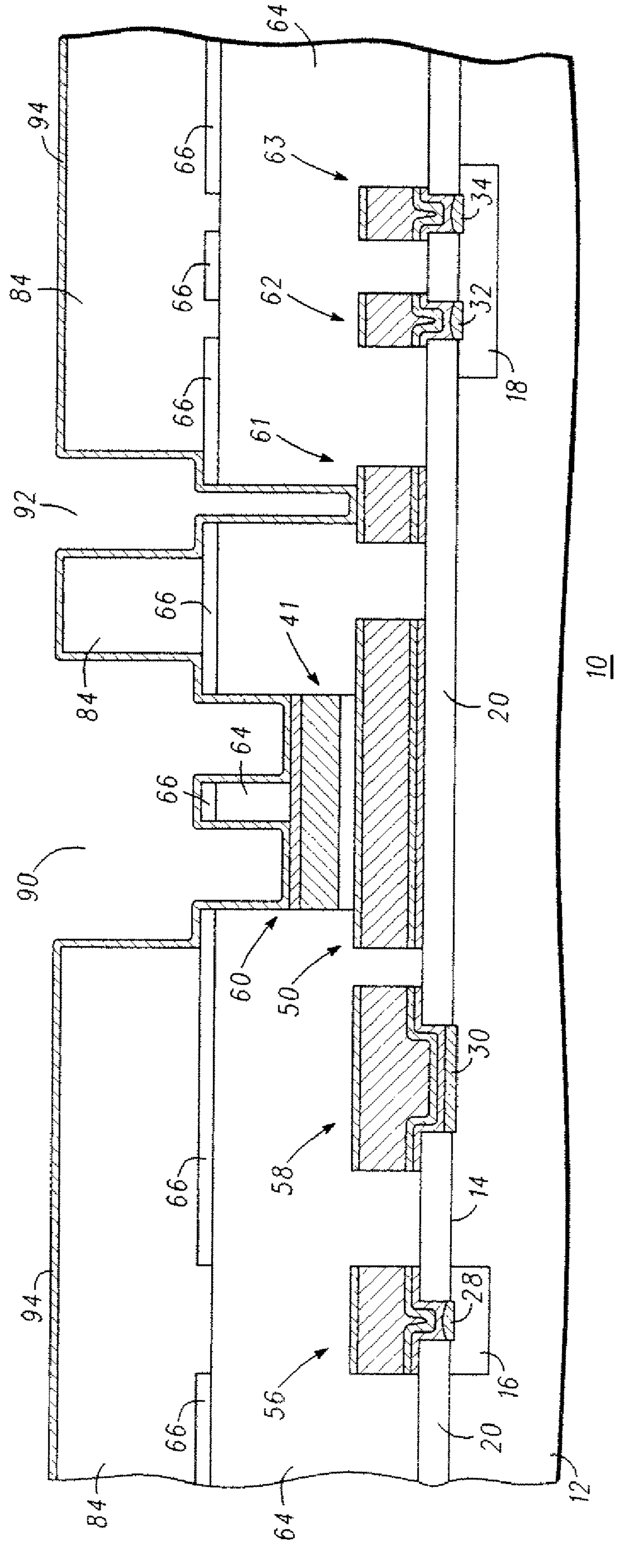
FIG. 11 is a cross-sectional view of the semiconductor component of FIG. 10 at a later stage of manufacture.

Referring now to FIG. 11, the exposed portions of dielectric layer 84 are anisotropically etched using, for example, a reactive ion etch and an etch chemistry that preferentially etches oxide. The etch stops on the exposed portions of silicon nitride layer 66, on the exposed portions of conductor 41, and on the exposed portion of conductor 61 leaving openings 90 and 92, which are also referred to as damascene openings. Masking structure 88 is removed. A barrier layer 94 is formed along the sidewalls of openings 90 and 92, on the exposed areas of portions 66, and on the exposed portions of conductors 41 and 61. By way of example, barrier layer 94 is titanium nitride. Alternatively, barrier layer 94 may be comprised of an adhesive sub-layer formed in contact with the sidewalls of openings 90 and 92 and in contact with the exposed regions of portions 66, and a barrier sub-layer. By way of example, the adhesive sub-layer is titanium and the barrier sub-layer is titanium nitride. The materials for the sub-layers are not limitations of the present invention.

Figure 12:
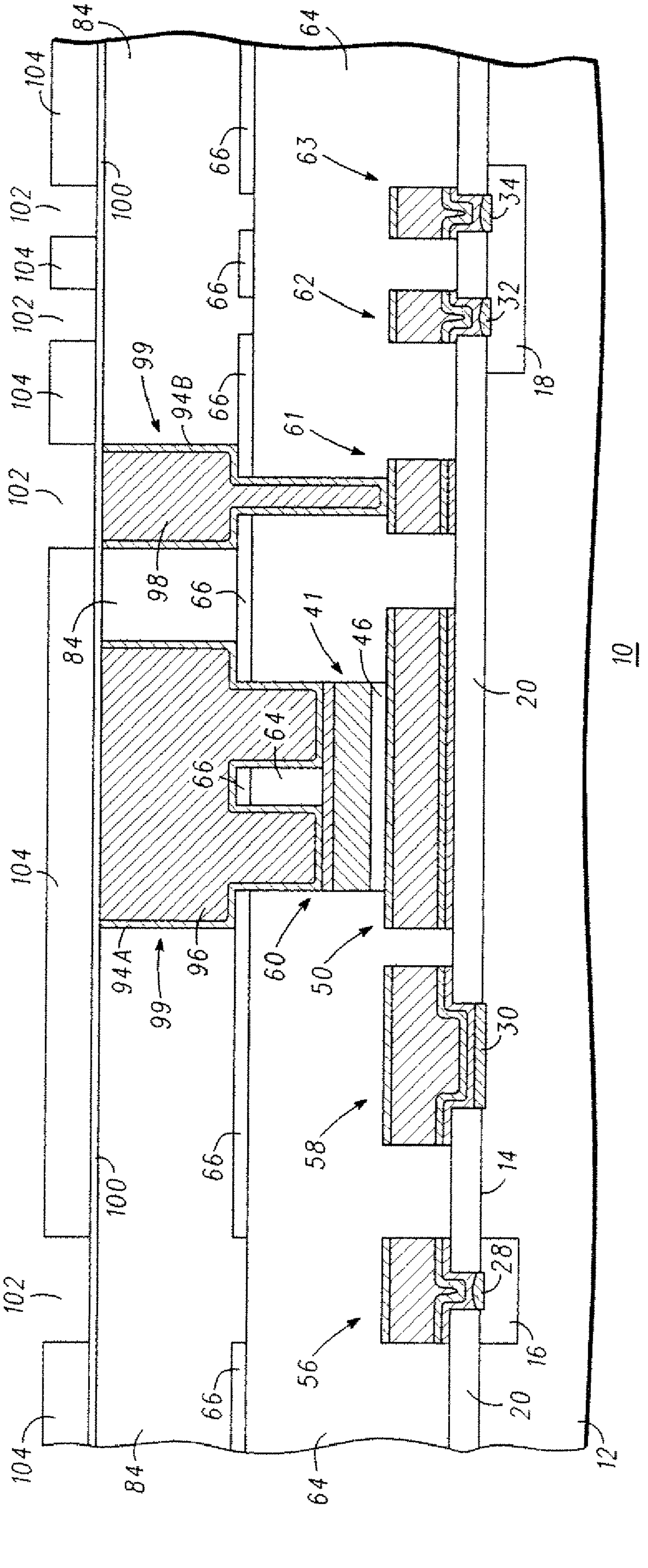
FIG. 12 is a cross-sectional view of the semiconductor component of FIG. 11 at a later stage of manufacture.

Referring now to FIG. 12, a layer of copper is formed over barrier layer 94. The layer of copper is planarized using, for example, a CMP technique The remaining portion 94A of barrier layer 94 and the copper in opening 90 cooperate to form a conductive trace 96 and the remaining portion 94B of barrier layer 94 and the copper in opening 92 cooperate to form a conductive trace 98. Conductive traces 96 and 98 in combination with damascene openings 90 and 92, respectively, are referred to as damascene structures and serve as portions of an inductor 99. A passivation layer 100 is formed on dielectric layer 84 and conductive traces 96 and 98. A layer of photoresist is formed on passivation layer 94 and patterned to have openings 102 that expose portions of passivation layer 94. The remaining portion of the photoresist layer serves as a masking structure 104.

Figure 13:
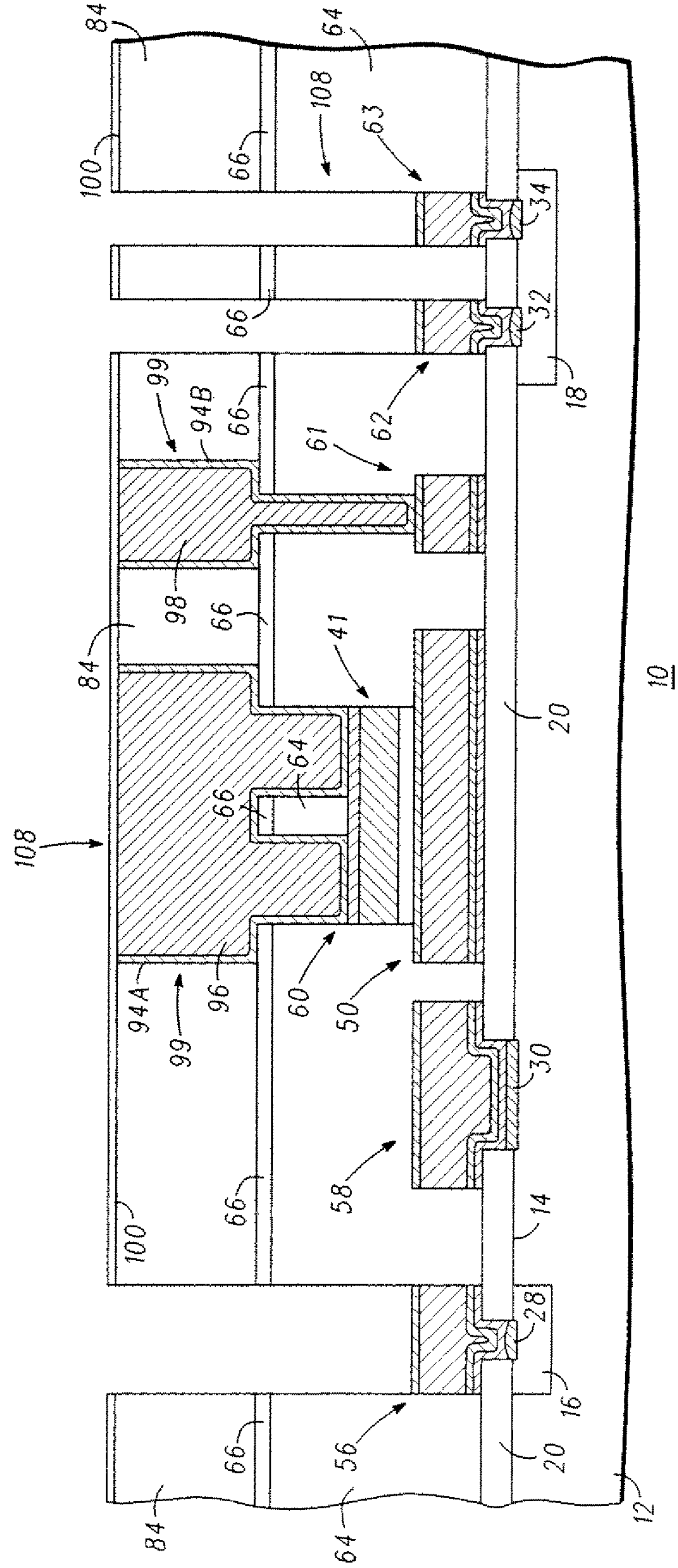
FIG. 13 is a cross-sectional view of the semiconductor component of FIG. 12 at a later stage of manufacture.

Referring now to FIG. 13, the exposed portions of passivation layer 100 and the portions of layers 84 and 64 are anisotropically etched using, for example a reactive ion etch to form contact openings to active and passive devices 16 and 18, respectively. Thus, an integrated passive device 108 has been provided that comprises a resistor disposed in a first vertical level, a capacitor disposed in a second vertical level, and an inductor disposed in a third vertical level. An advantage of integrated passive device 108 is that it is a vertically stacked device which occupies less area than circuit elements that are positioned laterally to each other. In addition, the inductor is manufactured using a damascene process which allows for smaller line-widths and spaces with aspect ratios of spaces and lines greater than 1:1.

Figure 14:
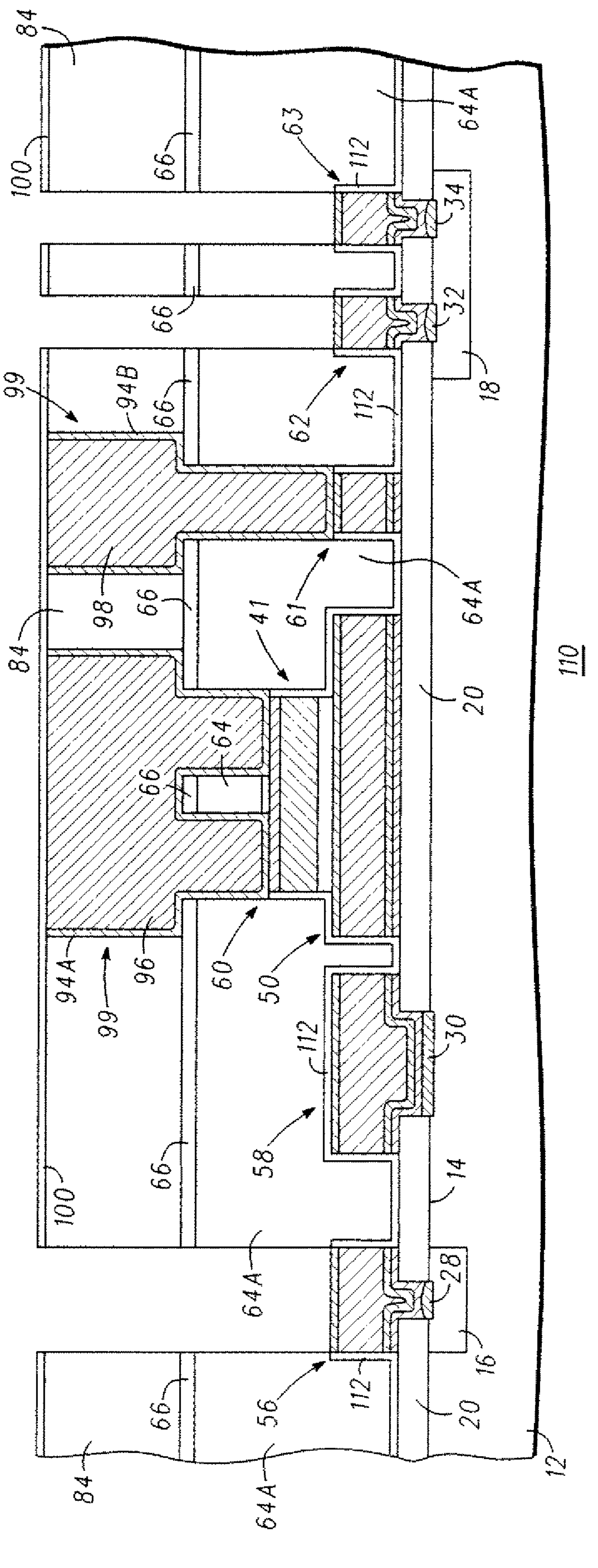
FIG. 14 is a cross-sectional view of a semiconductor component in accordance with another embodiment of the present invention.

FIG. 14 is a cross-sectional view of a semiconductor component 110 in accordance with another embodiment of the present invention. Semiconductor component 110 is similar to semiconductor component 10 except that after titanium nitride layer 36 and aluminum layer 35 have been etched, an etch stop layer 112 is formed on the exposed portions of dielectric layer 20 and the remaining portions of silicon nitride layers 36 and 39. By way of example, etch stop layer 112 is silicon nitride having a thickness ranging from about 150 Å to about 2,000 Å. Including etch stop layer 112 provides additional process margins for etches involved in forming, for example, the inductor and the pads.

Figure 15:
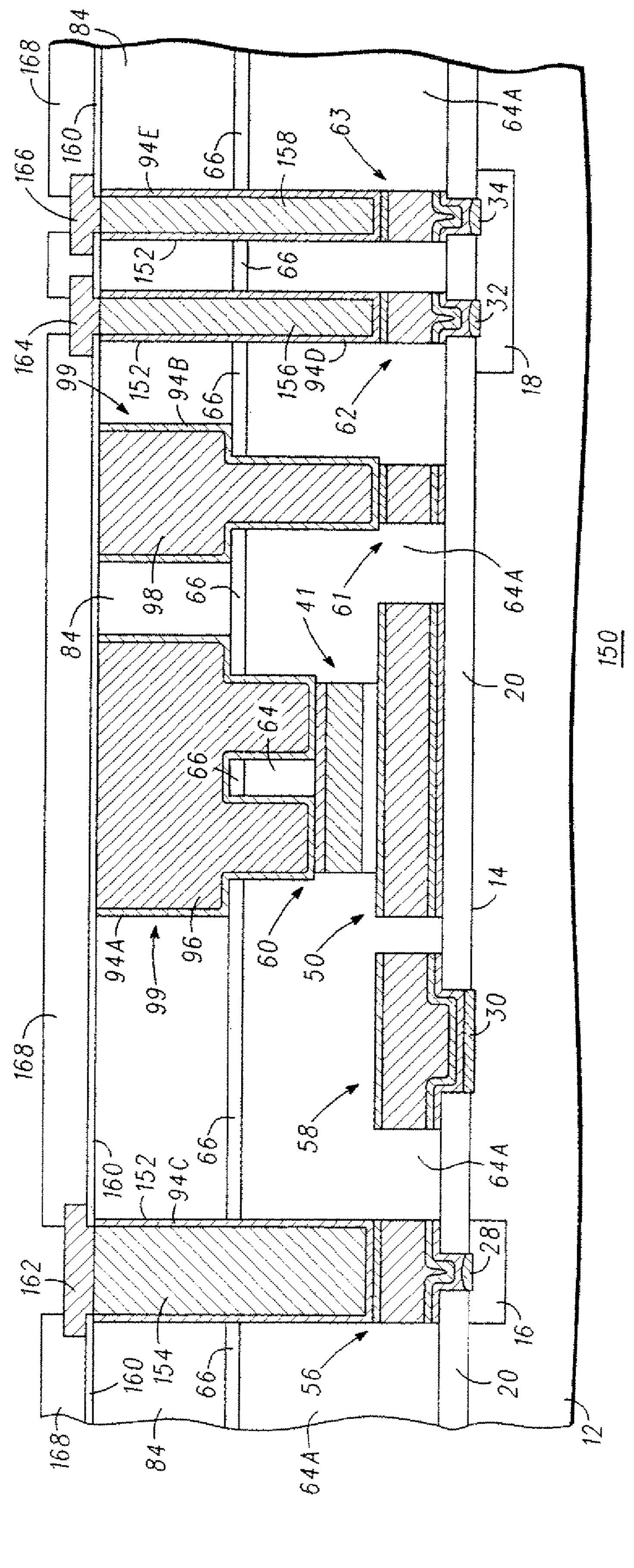
FIG. 15 is a cross-sectional view of a semiconductor component in accordance with another embodiment of the present invention.

FIG. 15 is a cross-sectional view of a semiconductor component 150 in accordance with another embodiment of the present invention. Semiconductor component 150 is similar to semiconductor component 10 except that openings 152 are formed contemporaneously with openings 90 and 92 (illustrated with reference to FIG. 11). Thus, barrier layer 94 is formed along the sidewalls of openings 90, 92, and 152 and on the exposed areas of conductors 41, 61, 56, 62, and 63. The copper that is formed on the portions of barrier layer 94 in openings 90 and 92 is also formed on the portions of the barrier layer in openings 152 and planarized using, for example, CMP to form conductors 154, 156, and 158. It should be noted that conductor 154 include portion 94C of barrier layer 94, conductor 156 includes portion 94D of barrier layer 94, and conductor 158 includes portion 94E of barrier layer 94.

A layer of silicon nitride 160 is formed on dielectric layer 84 and conductors 96, 98, 154, 156, and 158. Openings are formed in silicon nitride layer 160 and a layer of aluminum is formed on silicon nitride layer 160 and in the openings. A layer of photoresist is formed on the aluminum layer and patterned to have openings that expose portions of the aluminum layer. The exposed portions of the aluminum layer are etched leaving aluminum contacts 162, 164, and 166 in contact with conductors 154, 156, and 158, respectively. A layer of dielectric material 168 is formed on silicon nitride layer 160 and on aluminum contacts 162, 164, and 166. A layer of photoresist is formed on dielectric layer 168 and patterned to have openings that expose the portions of dielectric layer 168 that are over aluminum contacts 162, 164, and 166. The exposed portions of dielectric layer 168 are removed thereby exposing aluminum contacts 162, 164, and 166. Dielectric layers 160 and 168 serve as passivation layers. As those skilled in the art are aware, softer, spin-on types of materials are typically used to passivate copper. These softer types of materials are generally incompatible with wafer packaging techniques such as, for example, flip-chip packaging techniques. Forming aluminum over the copper in accordance with the present invention overcomes the difficulty with passivating copper circuit elements. Thus, the present invention allows vertically integrating passive circuit elements that are made from copper and packaging the circuit elements using silicon wafer packaging techniques.

Figure 16:
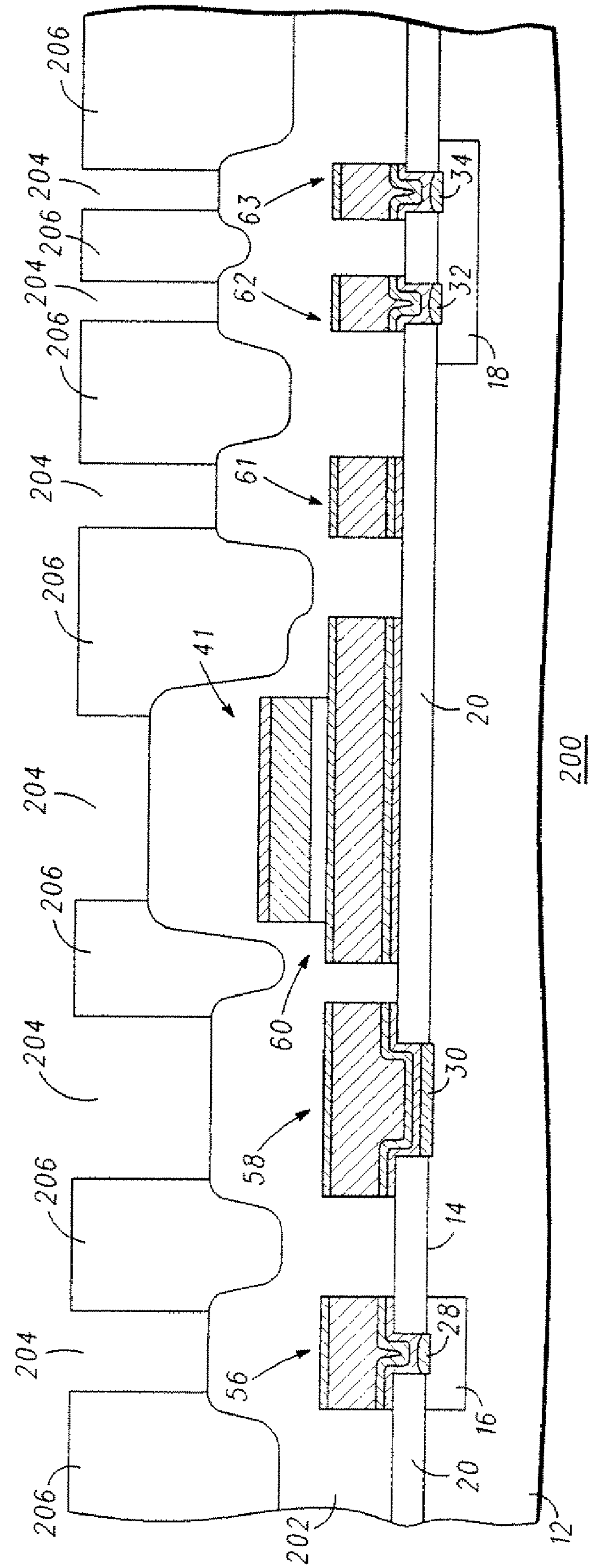
FIG. 16 is a cross-sectional view of a semiconductor component at a beginning stage of manufacture in accordance with another embodiment of the present invention.

FIG. 16 is a cross-sectional view of a semiconductor component 200 during manufacture in accordance with another embodiment of the present invention. It should be noted that the manufacturing steps described with reference to FIGS. 1-7 also apply to the manufacture of semiconductor component 200. Thus, the description of FIG. 16 continues from the description of FIG. 7 with reference number 10 in FIG. 7 being replaced by reference number 200. A layer of dielectric material 202 having a thickness ranging from about 2,000 Å to about 12,000 Å is formed on conductors 41, 56, 58, 61, 62, 63, the exposed portion of conductor 60, and the exposed portion of dielectric layer 202. In accordance with an embodiment of the present invention, dielectric material 202 is silicon nitride. The type of material for dielectric layer 202 is not a limitation of the present invention. A layer of photoresist is formed on silicon nitride layer 202 and patterned to have openings 204 that expose portions of silicon nitride layer 202. The remaining portions of the photoresist layer serve as a masking structure 206.

Figure 17:
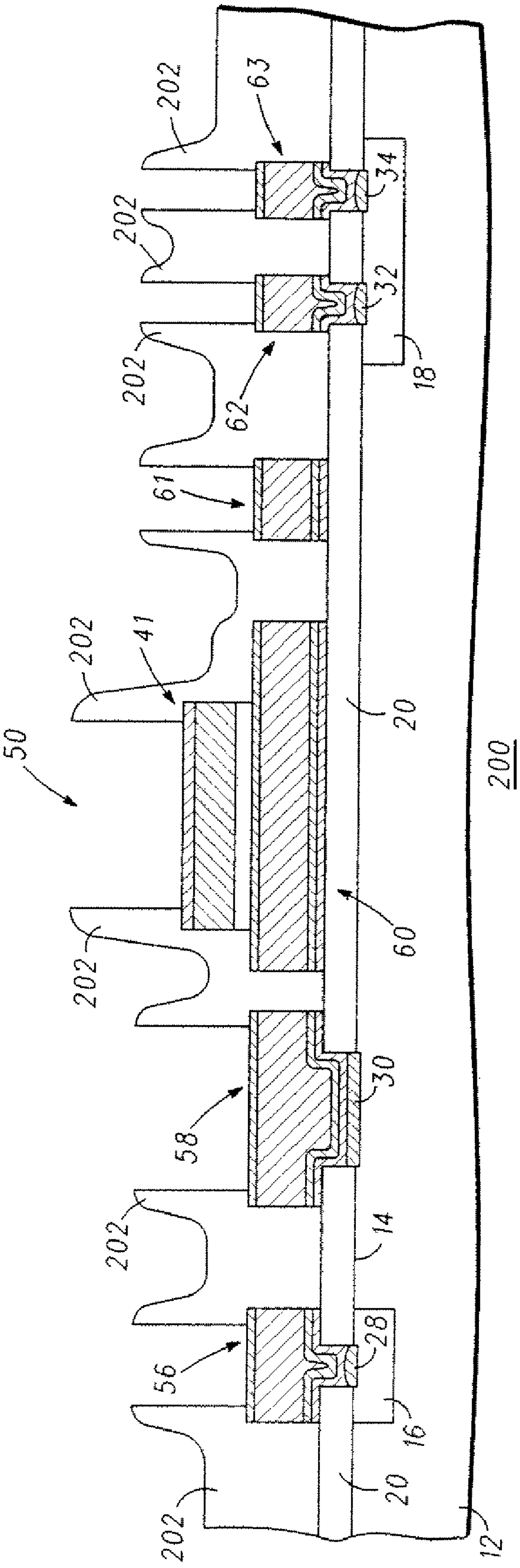
FIG. 17 is a cross-sectional view of the semiconductor component of FIG. 16 at a later stage of manufacture.

Referring now to FIG. 17, the exposed portions of Silicon Nitride layer 202 are anisotropically etched to expose conductors 56, 58, 41, 61, 62, and 63. Masking structure 206 is removed.

Figure 18:
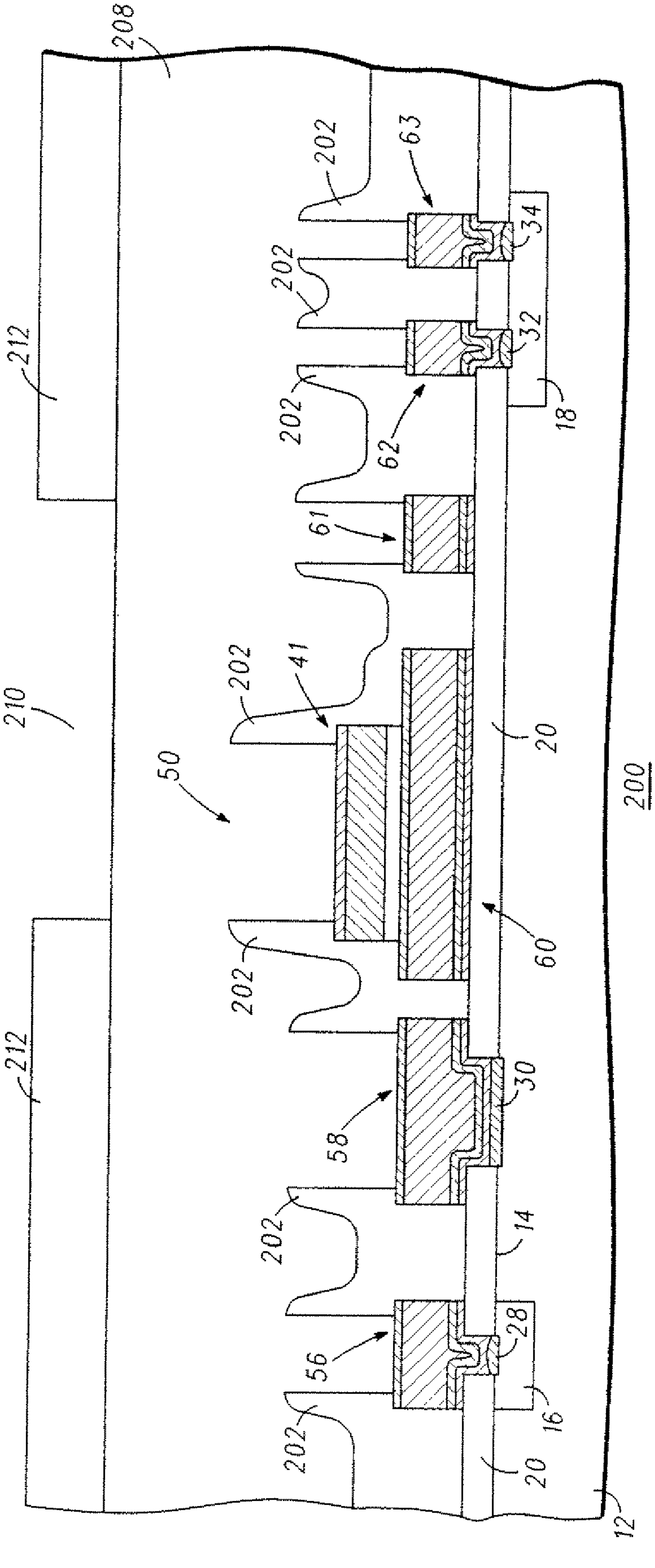
FIG. 18 is a cross-sectional view of the semiconductor component of FIG. 17 at a later stage of manufacture.

Referring now to FIG. 18, a layer of dielectric material 208 is formed on the exposed portions of conductors 41, 56, 58, 61, 62, 63, and on the remaining portions of dielectric layer 202. In accordance with one embodiment of the present invention, dielectric material 208 is TEOS. The type of material for dielectric layer 208 is not a limitation of the present invention. Preferably, the dielectric material of layer 202 has a different etch selectivity than the dielectric material of dielectric layer 208. Dielectric layer 208 is planarized using a planarization technique such as, for example, CMP to have a thickness ranging from about 10,000 Å to about 120,000 Å above conductor 41, which is one of the electrodes or plates of MIM capacitor 50. A layer of photoresist is formed on TEOS layer 208 and patterned to have an opening 210 that exposes a portion of layer 208. The remaining portions of the photoresist layer serve as a masking structure 212.

Figure 19:
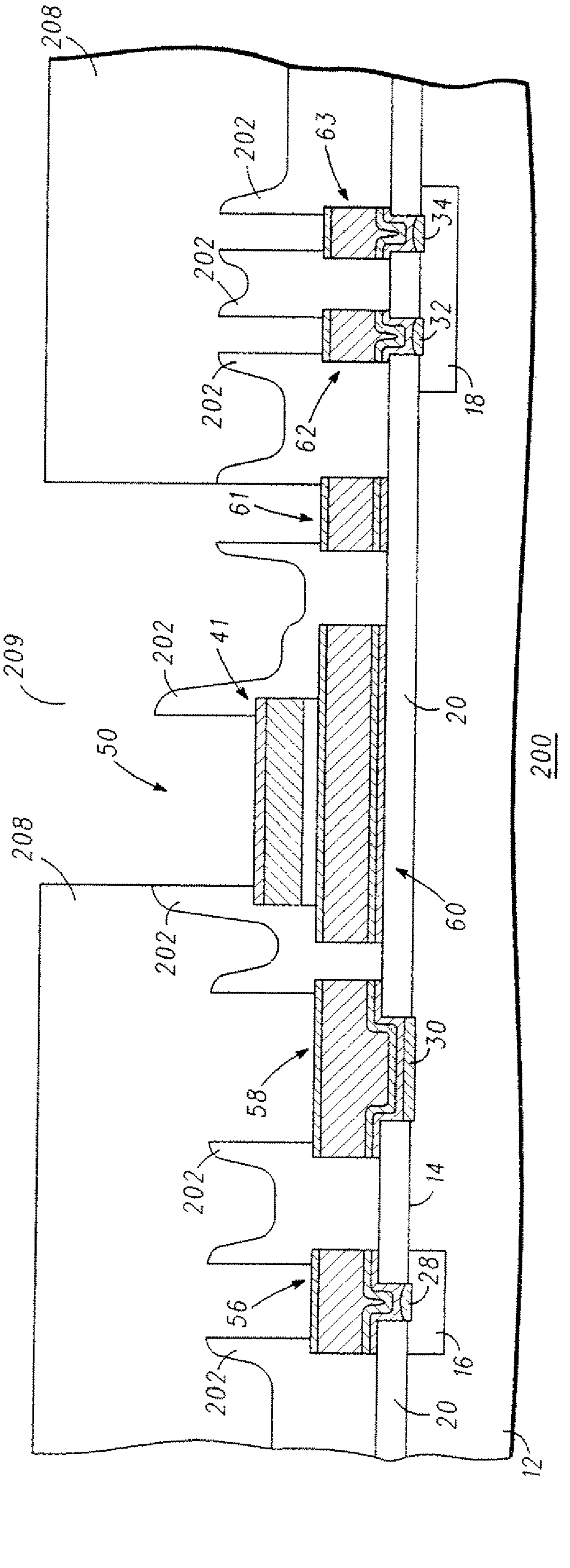
FIG. 19 is a cross-sectional view of the semiconductor component of FIG. 18 at a later stage of manufacture.

Referring now to FIG. 19, the exposed portion of TEOS layer 208 is anisotropically etched to form an opening 209 that exposes conductors 41 and 61 and the remaining portion of silicon nitride layer 202 that is between conductors 41 and 61. This anisotropic etching process is enhanced if the dielectric 208 is etched selectively to dielectric 202. Masking structure 212 is removed.

Figure 20:
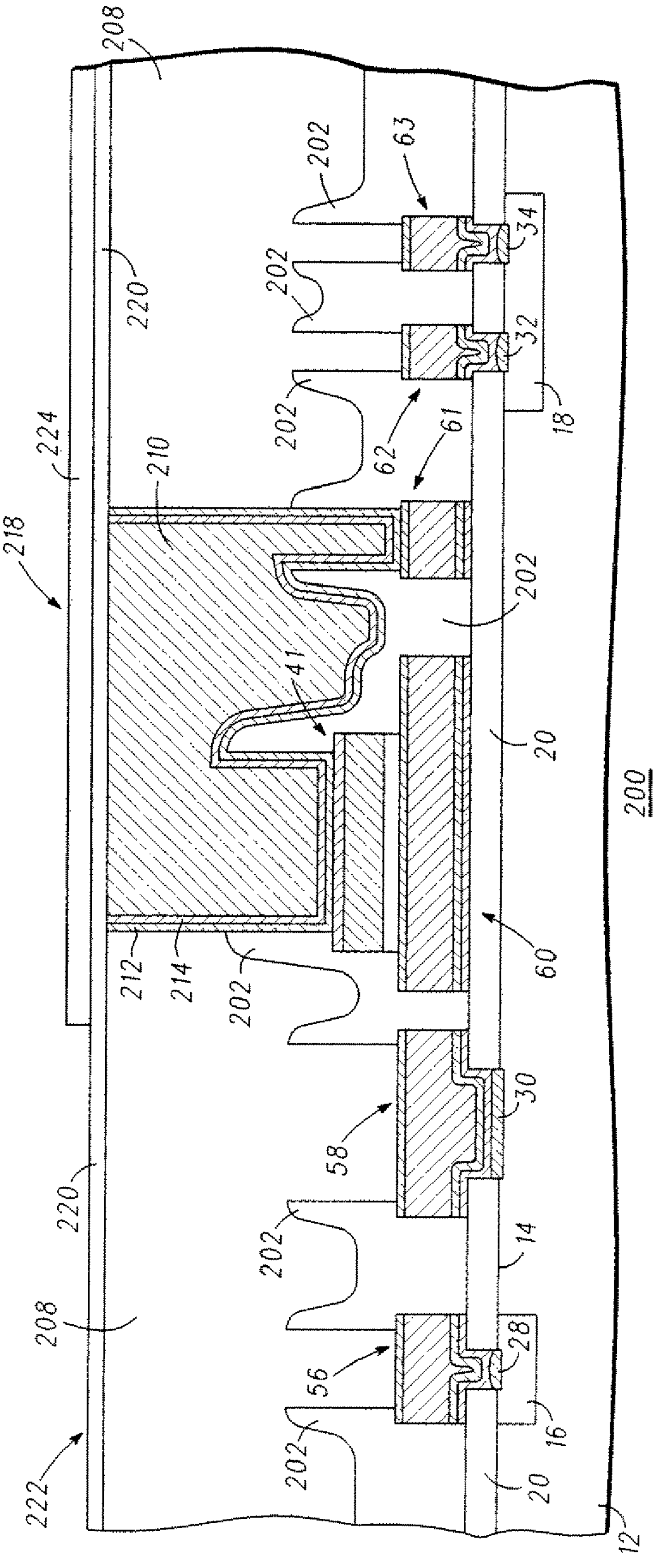
FIG. 20 is a cross-sectional view of the semiconductor component of FIG. 19 at a later stage of manufacture.

Referring now to FIG. 20, a layer of tantalum having a thickness ranging from about 50 Å to about 250 Å is formed on TEOS layer 208 and in opening 209. A layer of tantalum nitride having a thickness ranging up to about 250 Å is formed on the tantalum layer. A layer of copper having thickness ranging from about 11,000 Å to about 130,000 Å is formed on the tantalum nitride layer. The copper, tantalum nitride, and tantalum layers are planarized using, for example, CMP. TEOS layer 208 serves as an etch stop layer. After the CMP step, portions 210, 212, and 214 of the copper layer, the tantalum nitride layer, and the tantalum layer remain in opening 209. Portions 210, 212, and 214 cooperate to form a conductor 218. It should be noted that the use of tantalum and tantalum nitride are not limitations of the present invention and that other materials may be formed between TEOS layer 208 and the layer of copper.

A layer of dielectric material 220 having a thickness ranging from about 2,000 Å to about 10,000 Å is formed on conductor 218 and on portions of TEOS layer 208. By way of example, the material of dielectric layer 220 is silicon nitride. A layer of photoresist is formed on dielectric layer 220 and patterned to expose a portion 222 of silicon nitride layer 220. The remaining portion of the photoresist layer serves as a masking structure 224.

Figure 21:
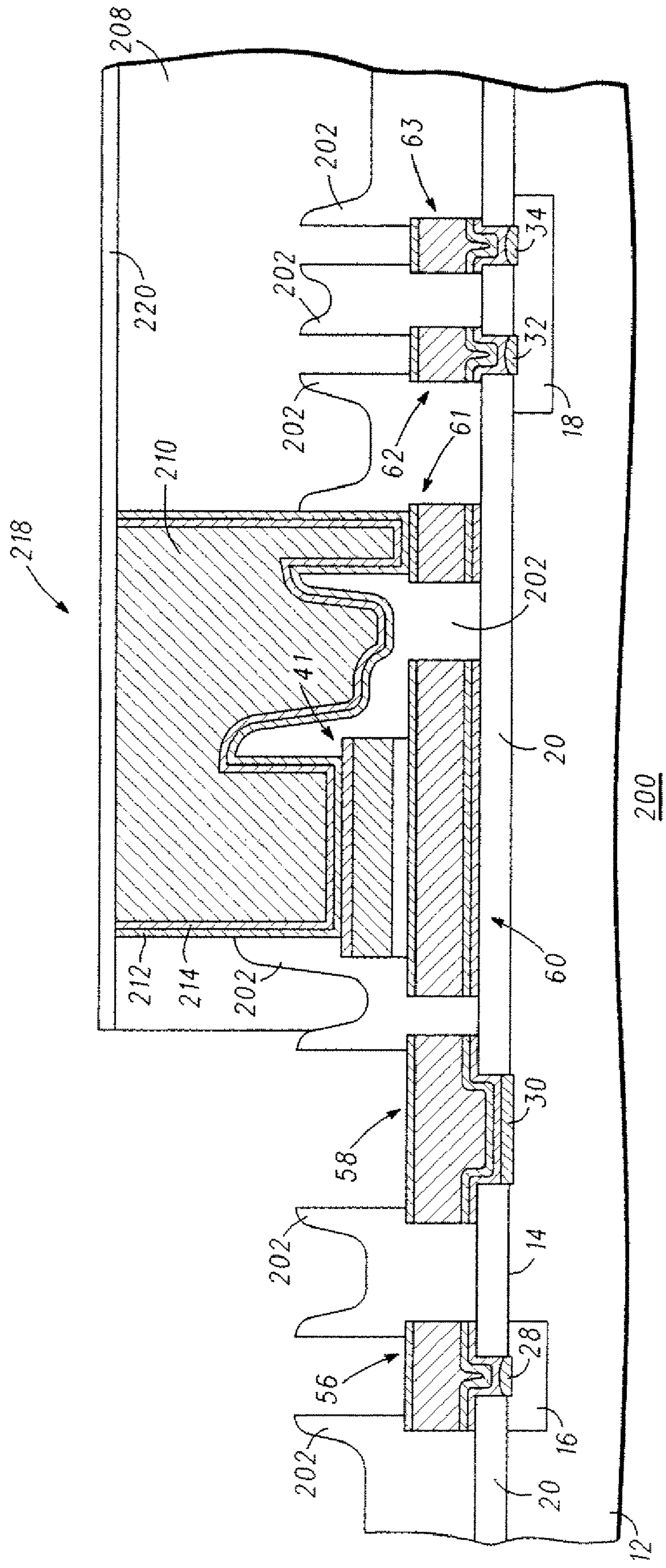
FIG. 21 is a cross-sectional view of the semiconductor component of FIG. 20 at a later stage of manufacture.

Referring now to FIG. 21, the exposed portion of silicon nitride layer 220 is anisotropically etched to form an opening that exposes conductors 56 and 58 and the portions of TEOS layer 202 that are laterally adjacent to conductors 56 and 58. Masking structure 224 is removed.

Figure 22:
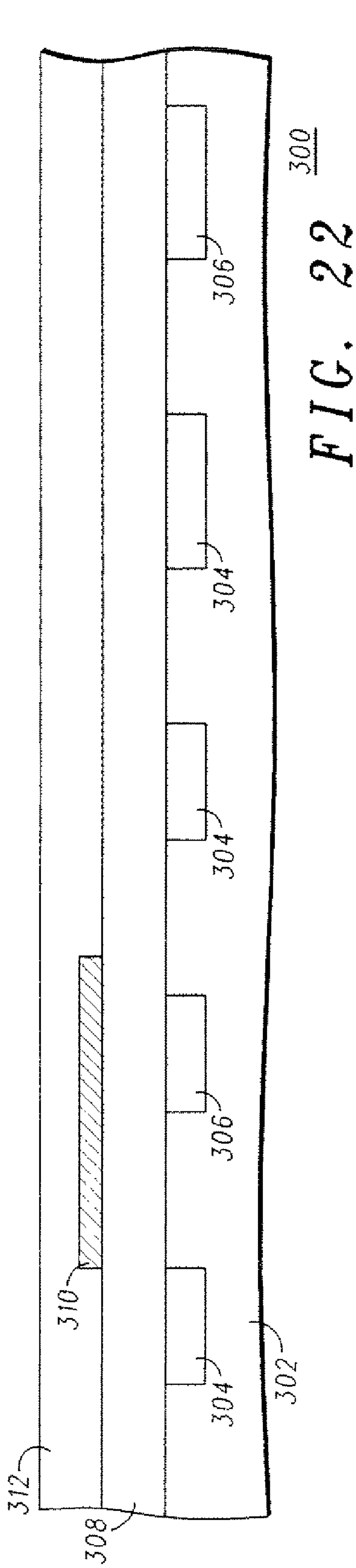
FIG. 22 is a cross-sectional view of a semiconductor component at a beginning stage of manufacture in accordance with another embodiment of the present invention.

FIG. 22 is a cross sectional view of a semiconductor component 300 in accordance with another embodiment of the present invention. What is shown in FIG. 22 is a semiconductor substrate 302 from which are formed a plurality of active devices 304 and a plurality of passive devices 306. Active devices 304 may be diodes, Zener diodes, thyristors, field effect transistors, bipolar transistors, combinations thereof, or the like and passive devices 306 may be a resistor, a capacitor, an inductor, combinations thereof or the like. Although a plurality of active and passive devices have been described, it should be understood that one or more active or passive devices may be formed in or on substrate 302. Alternatively, substrate 302 may be devoid of active devices, passive devices, or active and passive devices. One or more of devices 304 and 306 may be electrically connected to each other.

In accordance with one embodiment of the present invention, substrate 302 is silicon doped with an impurity material of P-type conductivity such as, for example, boron. By way of example, the resistivity of substrate 302 ranges from about 0.001 Ω-cm to about 10,000 Ω-cm. The substrate resistivity is selected in accordance with the design criteria of the various semiconductor components. Although substrate 302 may be a high resistivity substrate, the resistivity or dopant concentration of substrate 302 is not a limitation of the present invention. Likewise, the type of material for substrate 302 is not limited to being silicon and the conductivity type of substrate 302 is not limited to being P-type conductivity. A layer of dielectric material 308 is formed on substrate 302 and a resistor 310 is formed on dielectric layer 308. A layer of dielectric material 312 is formed on dielectric layer 308 and resistor 310. In accordance with one embodiment, resistor 310 is a metal resistor. Suitable materials for metal resistor 310 include titanium nitride, titanium tungsten nitride ("TiWN"), nickel, tungsten, tantalum, tantalum nitride, or the like. It should be noted that resistor 310 is not limited to being a metal resistor. Alternatively, it can be made from a semiconductor material such as, for example, doped polysilicon.

Figure 23:
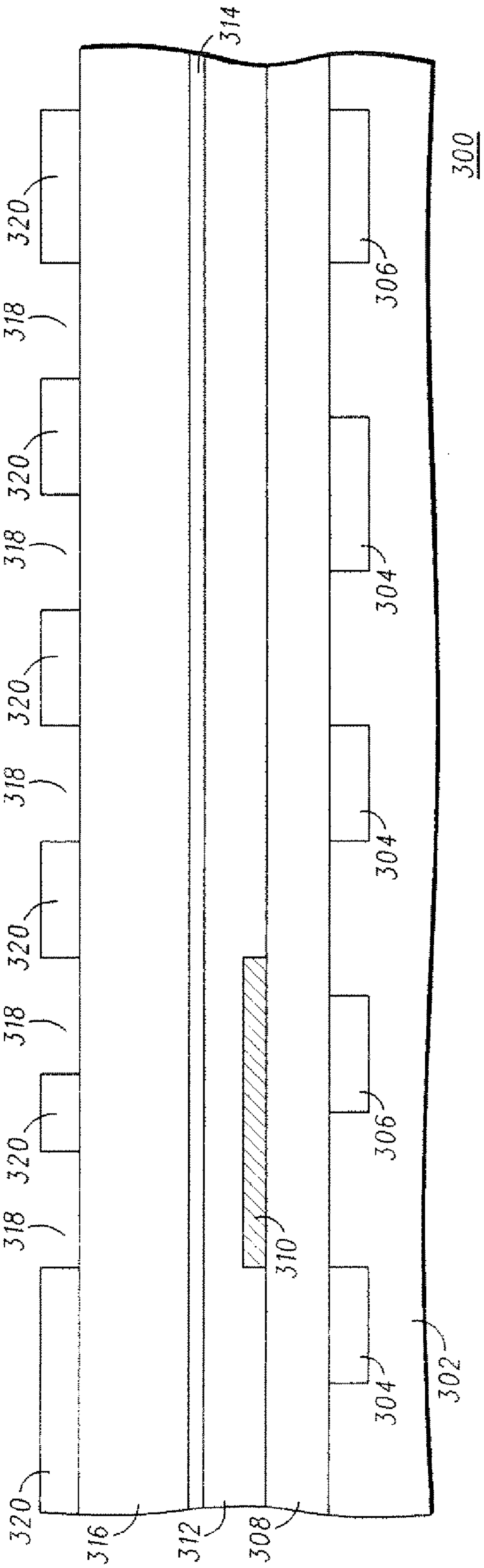
FIG. 23 is a cross-sectional view of the semiconductor component of FIG. 22 at a later stage of manufacture.

Referring now to FIG. 23, a layer of dielectric material 314 having a thickness ranging from about 2,000 Å to about 10,000 Å is formed on dielectric layer 312. A layer of dielectric material 316 having a thickness ranging from about 10,000 Å to about 120,000 Å is formed on silicon nitride layer 314. Although the material of layer 314 is silicon nitride and the material of dielectric layer 316 is TEOS in accordance with one embodiment, the material for layers 314 and 316 are not limited to being silicon nitride and TEOS. However, it is desirable that the material for layer 314 have a different etch rate than the material of layers 312 and 316. Thus, dielectric layer 314 is resistant to an etchant that etches dielectric layers 312 and 316.

A layer of photoresist is formed on TEOS layer 316 and patterned to have openings 318 that expose portions of TEOS layer 316. The remaining portions of the photoresist layer serve as a masking structure 320.

Figure 24:
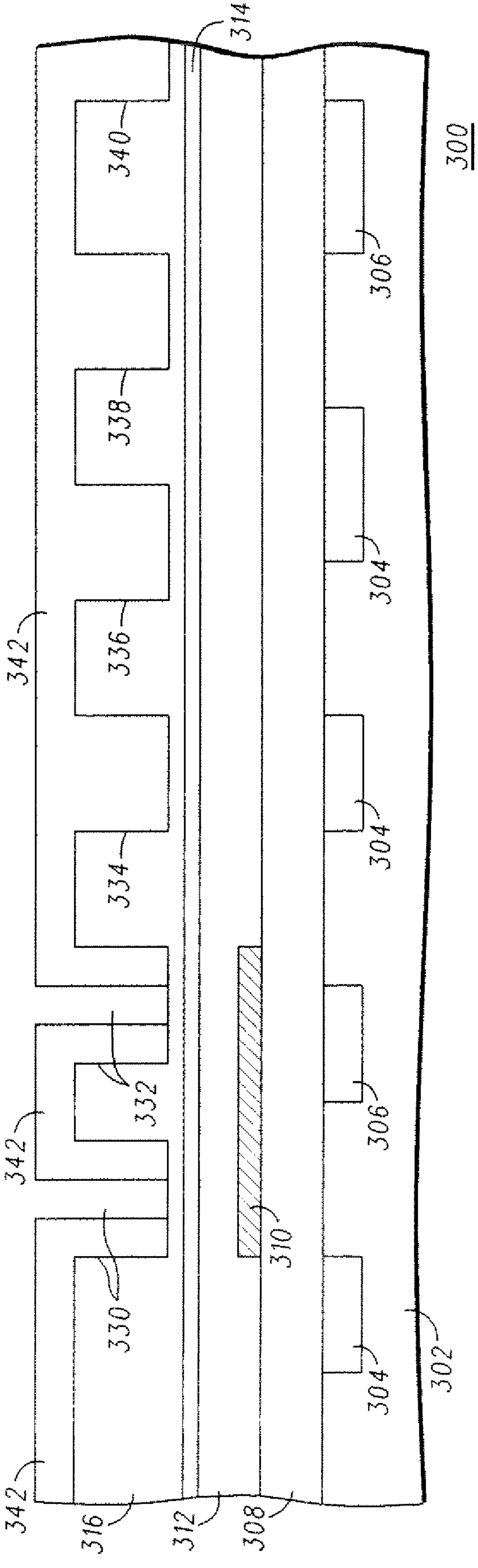
FIG. 24 is a cross-sectional view of the semiconductor component of FIG. 23 at a later stage of manufacture.

Referring now to FIG. 24, the exposed portions of TEOS layer 316 are anisotropically etched to form openings 330, 332, 334, 336, 338, and 340 in TEOS layer 316. In accordance with one embodiment, the etch is a timed etch that ends before openings 330-340 extend to silicon nitride layer 314. In accordance with another embodiment, silicon nitride layer 314 serves as an etch stop layer and openings 330-340 extend to silicon nitride layer 314. Openings 330-340 are also referred to as damascene openings. Masking structure 320 is removed and another layer of photoresist is formed on TEOS layer 316 and in openings 330-340. The photoresist layer is patterned to re-open portions of openings 330 and 332. The remaining portions of the photoresist layer serve as a masking structure 342.

Figure 25:
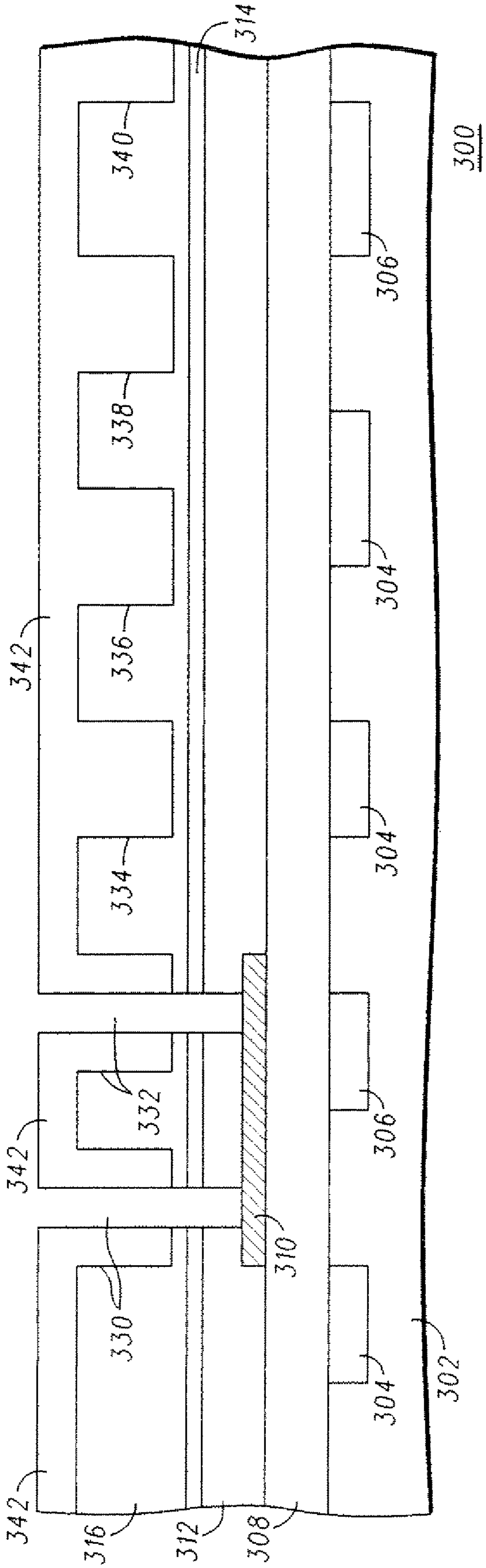
FIG. 25 is a cross-sectional view of the semiconductor component of FIG. 24 at a later stage of manufacture.

Referring now to FIG. 25, the portions of TEOS layer 316, silicon nitride layer 314, and TEOS layer 312 underlying the re-opened portions of openings 330 and 332 are anisotropically etched using, for example, a reactive ion etch. The etch exposes end regions of resistor 310. Masking structure 342 is removed.

Figure 26:
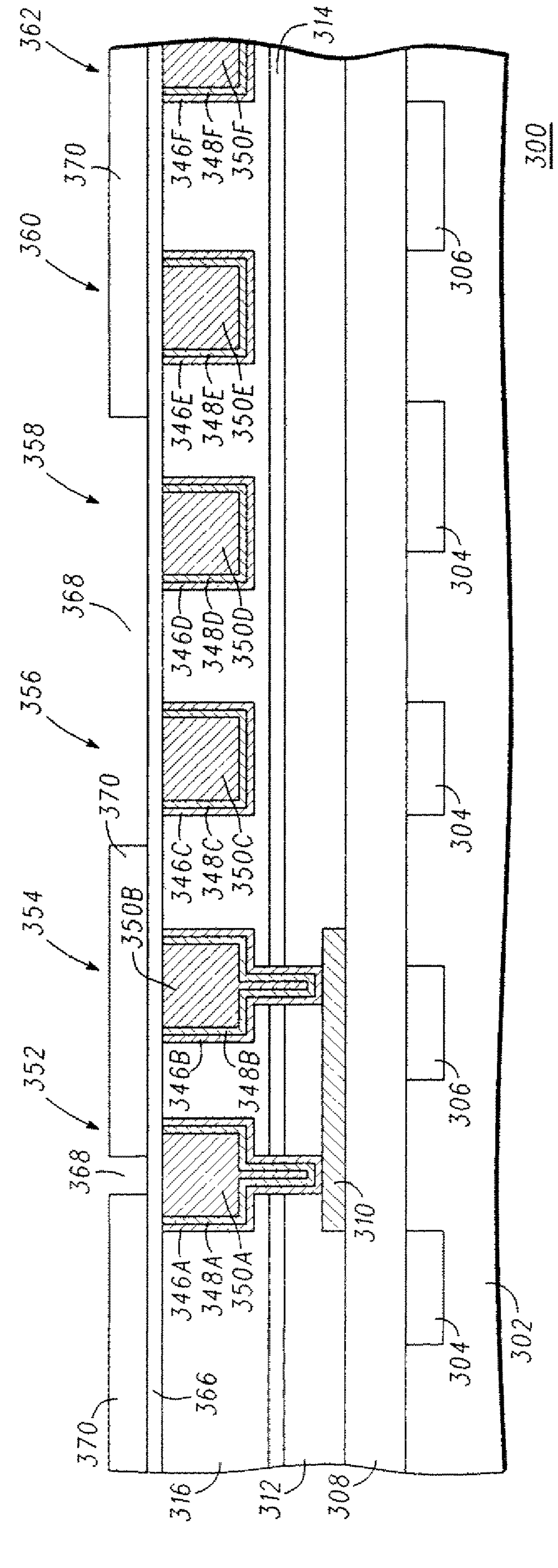
FIG. 26 is a cross-sectional view of the semiconductor component of FIG. 25 at a later stage of manufacture.

Referring now to FIG. 26, a layer of tantalum is formed on TEOS layer 316 and the exposed portions of resistor 310 and a layer of tantalum nitride is formed on the layer of tantalum. A layer of copper is formed on the layer of tantalum nitride and preferably fills openings 330-340. The copper layer, the tantalum nitride layer, and the tantalum layer are planarized using, for example, a CMP technique. TEOS layer 316 serves as an etch stop layer. After the planarization step, portions 346A, 346B, 346C, 346D, 346E, and 346F of the tantalum layer remain in openings 330-340, respectively; portions 348A, 348B, 348C, 348D, 348E, and 348F of the tantalum nitride layer remain on portions 346A-346F, respectively;

and portions 350A, 350B, 350C, 350D, 350E, and 350F of the copper layer remain on portions 348A-348F, respectively. Portions 346A, 348A, and 350A cooperate to form a conductor 352; portions 346B, 348B, and 350B cooperate to form a conductor 354; portions 346C, 348C, and 350C cooperate to form a conductor 356; portions 346D, 348D, and 350D cooperate to form a conductor 358; portions 346E, 348E, and 350E cooperate to form a conductor 360; and portions 346F, 348F, and 350F cooperate to form a conductor 362. It should be understood that the material of tantalum, tantalum nitride and copper layers is not a limitation of the present invention. Other suitable materials for use in place of tantalum include titanium, tungsten, platinum, a refractory metal compound, a refractory metal carbide, a refractory metal boride, or the like and other suitable materials for tantalum nitride include, titanium nitride, a metal nitride doped with carbon, a metal nitride doped with silicon, or the like. Conductors 352-362 in combination with damascene openings 330-340, respectively, are referred to as damascene structures and may serve as portions of an integrated passive device.

A layer of dielectric material 366 having a thickness ranging from about 1,000 Å to about 4,000 Å is formed over TEOS layer 316 and conductors 352-362. Preferably the dielectric material of layer 366 is silicon nitride. A layer of photoresist is formed on silicon nitride layer 366 and patterned to have openings 368 that expose portions of silicon nitride layer 366. The remaining portions of the photoresist layer serve as a masking structure 370.

Figure 27:
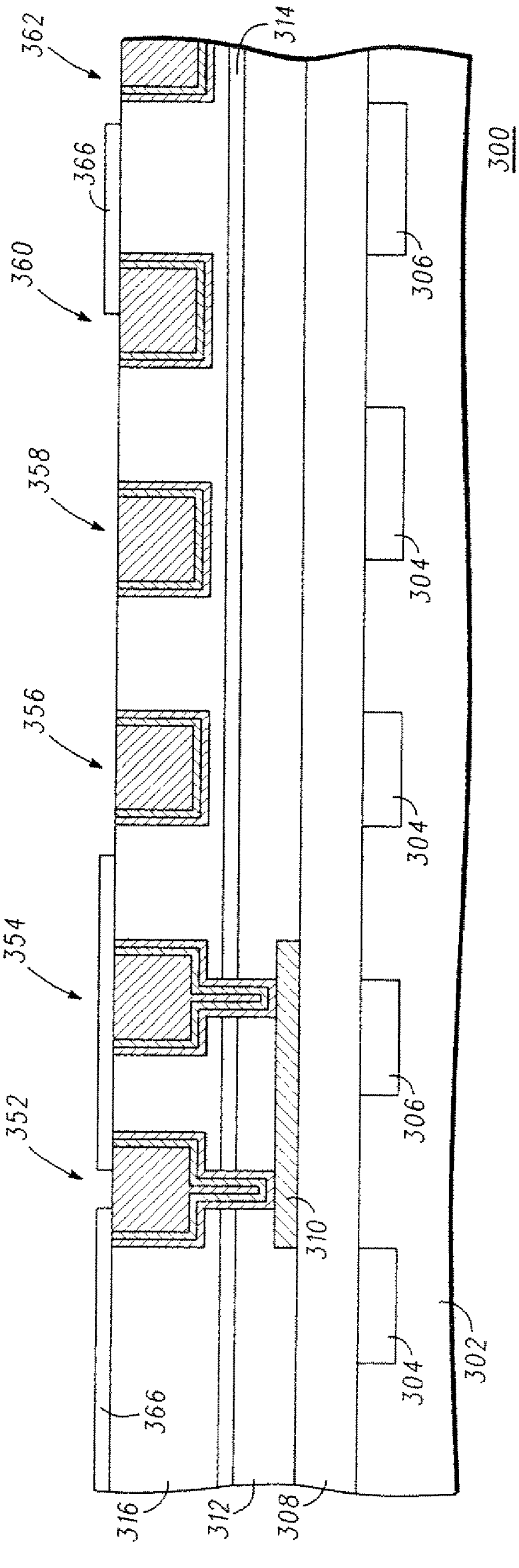
FIG. 27 is a cross-sectional view of the semiconductor component of FIG. 26 at a later stage of manufacture.

Referring now to FIG. 27, the exposed portions of silicon nitride layer 366 are anisotropically etched using, for example, a reactive ion etch to expose portions of conductors 352, 356, 358, 360, and 362. Masking structure 370 is removed.

Figure 28:
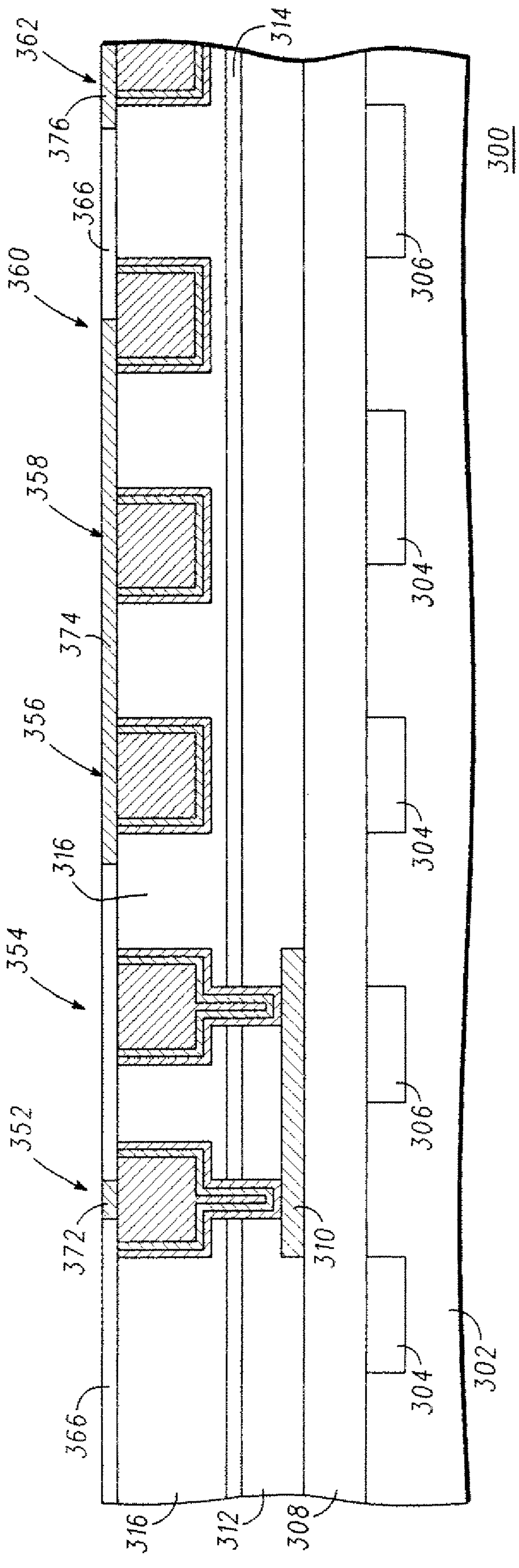
FIG. 28 is a cross-sectional view of the semiconductor component of FIG. 27 at a later stage of manufacture.

Referring now to FIG. 28, a layer of aluminum is formed on silicon nitride layer 366 and the exposed portions of conductors 352, 356, 358, 360, and 362. The aluminum layer is planarized using, for example, CMP. Silicon nitride layer 366 serves as an etch stop for the planarization, which leaves a conductor 372 in contact with a portion of conductor 352, a conductor 374 in contact with conductors 356, 358, and 360, and a conductor 376 in contact with conductor 362.

Figure 29:
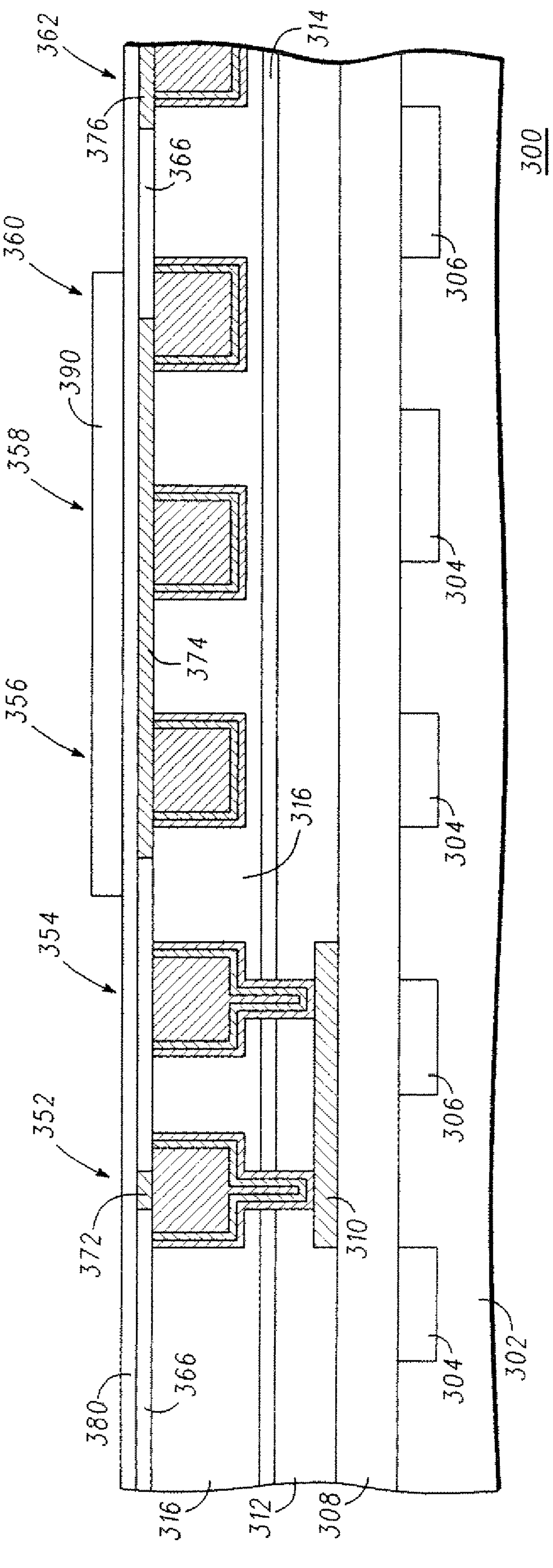
FIG. 29 is a cross-sectional view of the semiconductor component of FIG. 28 at a later stage of manufacture.

Referring now to FIG. 29, a layer of dielectric material 380 having a thickness ranging from about 400 Å to about 2,500 Å is formed on silicon nitride layer 366 and conductors 372, 374, and 376. Preferably the dielectric material of layer 380 is silicon nitride. A layer of photoresist is formed on silicon nitride layer 380 and patterned to form a masking structure 390. Masking structure 390 overlies conductors 356, 358, and 360.

Figure 30:
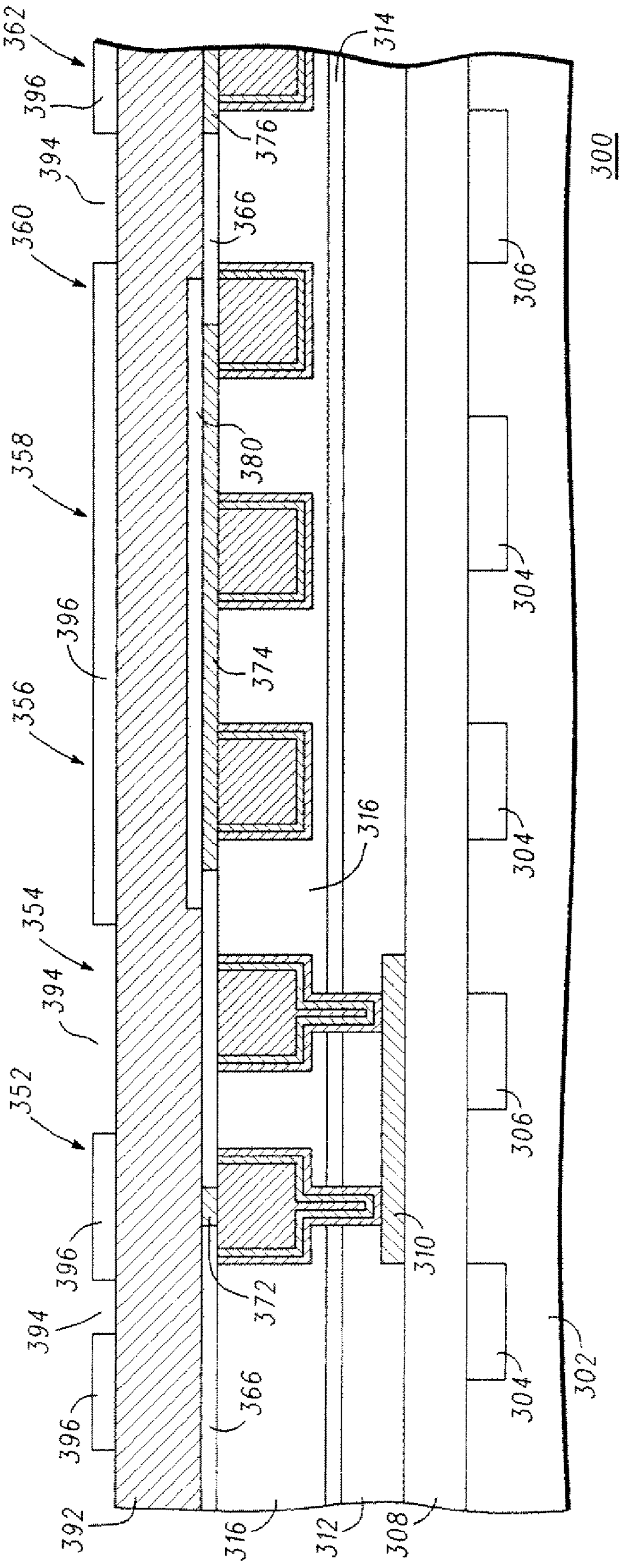
FIG. 30 is a cross-sectional view of the semiconductor component of FIG. 29 at a later stage of manufacture.

Referring now to FIG. 30, the exposed portions of silicon nitride layer 380 are anisotropically etched using, for example, a reactive ion etch. After removing the exposed portions of silicon nitride layer 380, conductors 372 and 376 and portions of silicon nitride layer 366 are exposed. A layer of aluminum 392 is formed on conductors 372 and 376, on the remaining portion of silicon nitride layer 380, and on the exposed portions of silicon nitride layer 366. Aluminum layer 392 is planarized using, for example, CMP. A layer of photoresist is formed on aluminum layer 392 and patterned to have openings 394 that expose portions of aluminum layer 392. The remaining portion of the photoresist layer serves as a masking structure 396.

Figure 31:
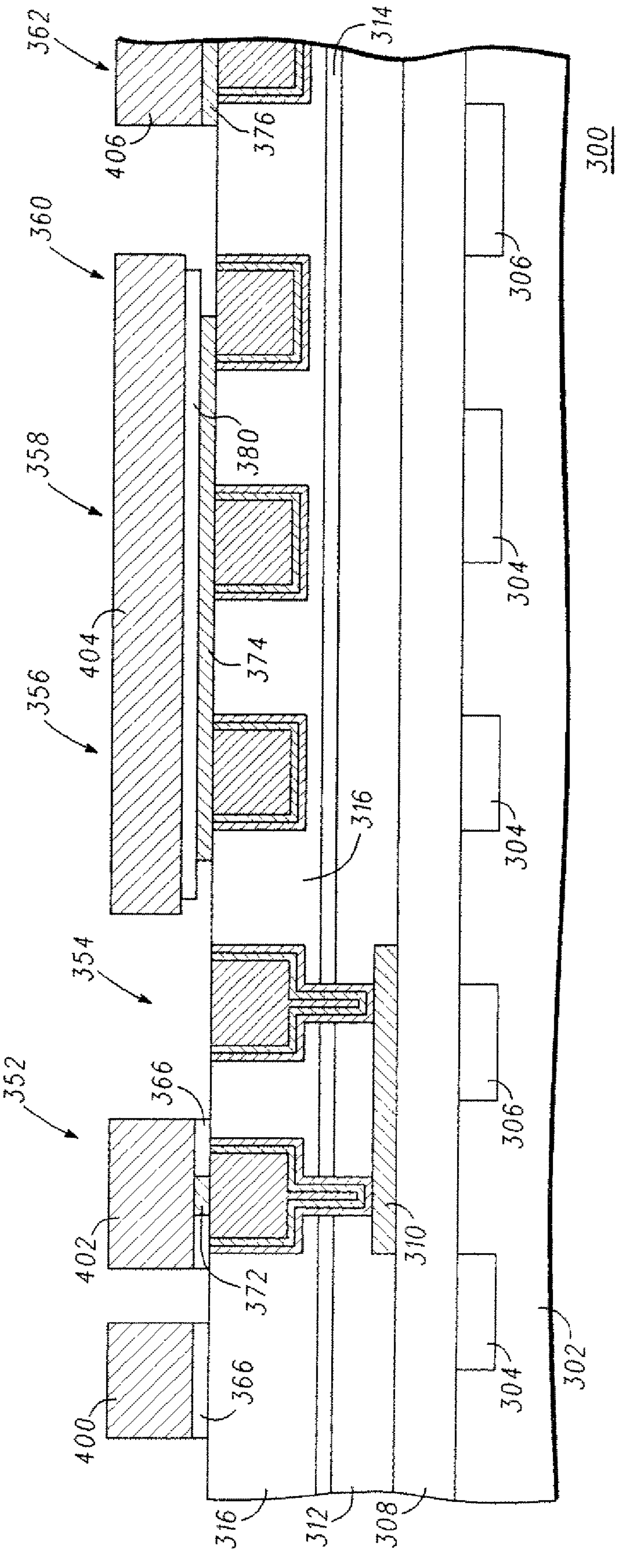
FIG. 31 is a cross-sectional view of the semiconductor component of FIG. 30 at a later stage of manufacture.

Referring now to FIG. 31, the exposed portions of aluminum layer 392 are anisotropically etched to form conductors 400, 402, 404, and 406. Etching aluminum layer 392 exposes portions of silicon nitride layer 366. The exposed portions are isotropically etched using a wet etchant. Because the etch is an isotropic etch, a portion of silicon nitride layer 380 below conductor 404 is laterally etched away.

Figure 32:
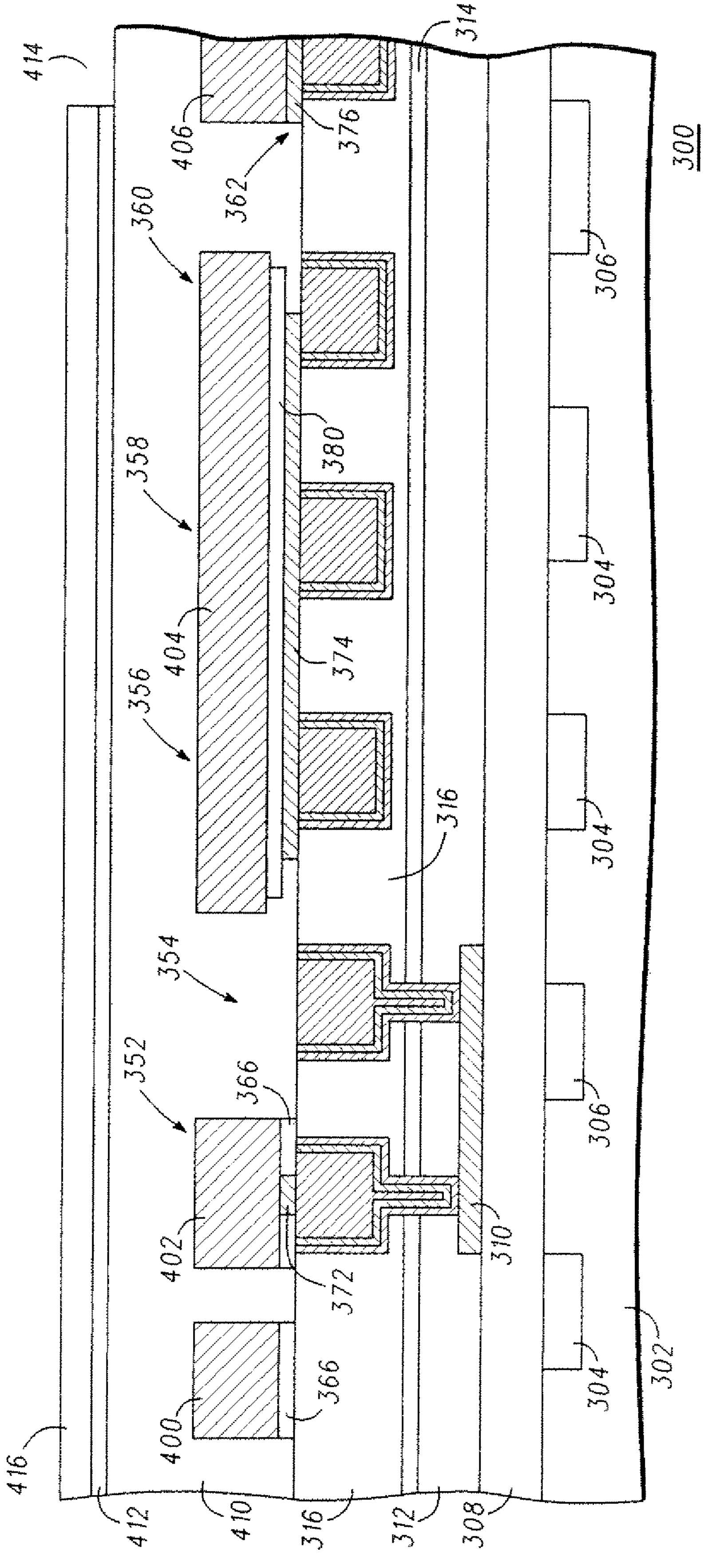
FIG. 32 is a cross-sectional view of the semiconductor component of FIG. 31 at a later stage of manufacture.

Referring now to FIG. 32, a layer of dielectric material 410 having a thickness ranging from about 4,000 Å to about 15,000 Å is formed on conductors 400-406, conductor 354, and the exposed portion of conductor 360 and on TEOS layer 316. A layer of dielectric material 412 having a thickness ranging from about 2,000 Å to about 10,000 Å is formed on dielectric layer 410. By way of example, dielectric material 410 is TEOS and dielectric material 412 is silicon nitride. Although the types of materials for dielectric materials 410 and 412 are not limitations of the present invention, it is desirable that they have different etching characteristics so that TEOS layer 410 can serve as an etch stop layer. Thus the etch is selective to dielectric layer 412. A layer of photoresist is formed on silicon nitride layer 412 and patterned to have an opening 414 that exposes a portion of silicon nitride layer 412 that is above conductor 406. The remaining portion of the photoresist layer forms a masking structure 416.

Figure 33:
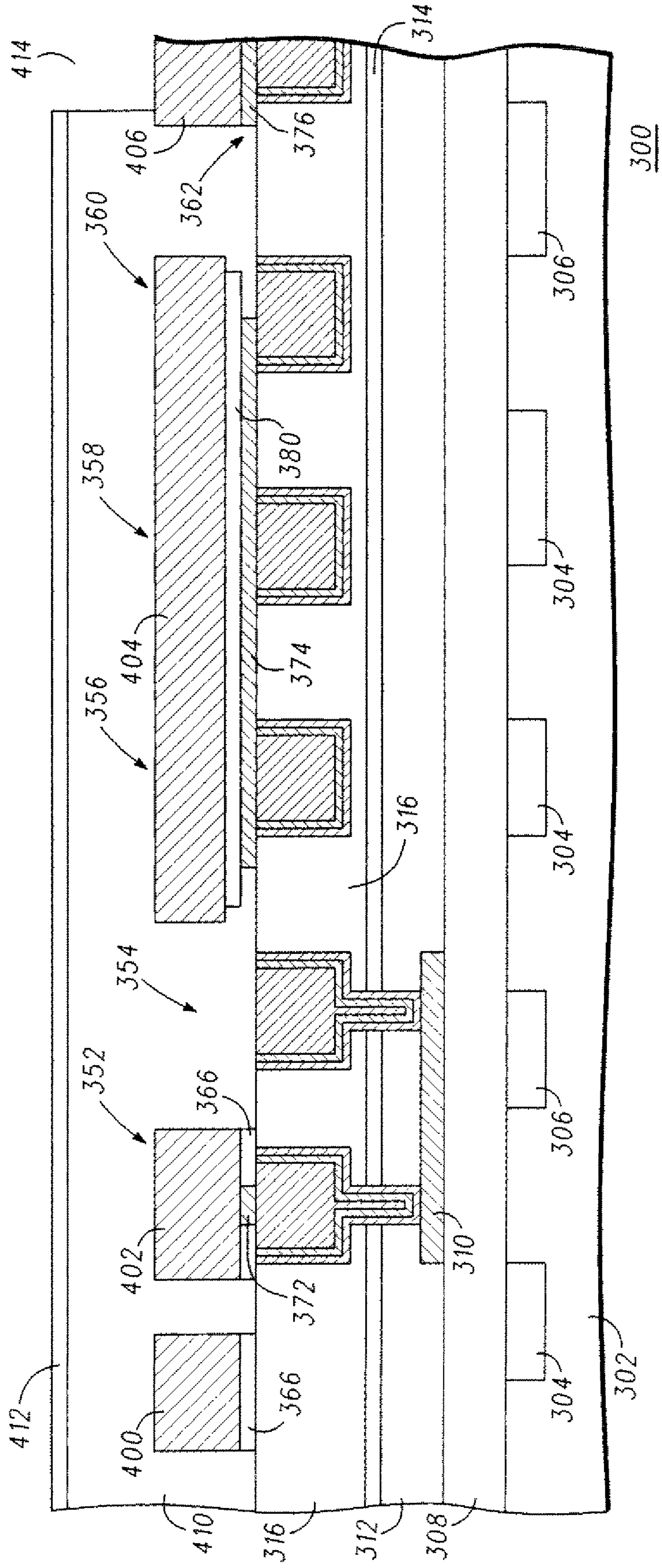
FIG. 33 is a cross-sectional view of the semiconductor component of FIG. 32 at a later stage of manufacture.

Referring now to FIG. 33, the exposed portion of silicon nitride layer 412 is anisotropically etched using, for example, reactive ion etching to expose a portion of TEOS layer 410. The etch chemistry is changed to anisotropically etch the exposed portion of TEOS layer 410 thereby exposing conductor 406. Masking structure 416 is removed. Conductor 406 serves as, for example, a wirebond pad.

Figure 34:
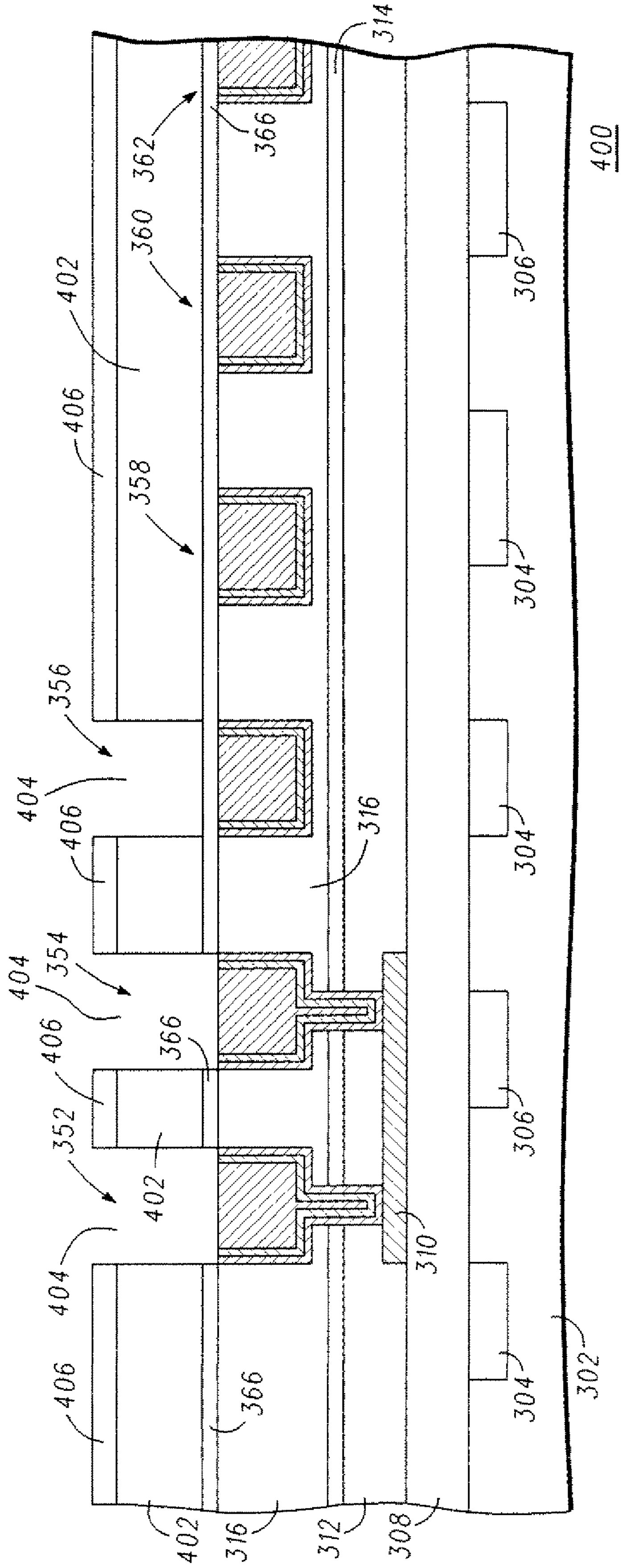
FIG. 34 is a cross-sectional view of a semiconductor component at a beginning stage of manufacture in accordance with another embodiment of the present invention.

FIG. 34 is a cross-sectional view of a semiconductor component 400 during manufacture in accordance with another embodiment of the present invention. It should be noted that the manufacturing steps described with reference to FIGS. 22-26 also apply to the manufacture of semiconductor component 400, except that the photoresist layer has a different pattern formed in it. Thus, the description of FIG. 34 continues from the description of FIG. 26 with reference number 300 in FIG. 26 being replaced by reference number 400. It should be noted that openings 368 and masking structure 370 are not formed in the embodiment described with reference to FIG. 34. In accordance with this embodiment, layer 366 has a thickness ranging from about 400 Å to about 2,500 Å.

A layer of dielectric material 402 having a thickness ranging from about 1,500 Å to about 4,000 Å is formed over silicon nitride layer 366. Preferably the dielectric material of layer 402 is TEOS. A layer of photoresist is formed on TEOS layer 402 and patterned to have openings 404 that expose portions of TEOS layer 402. The remaining portions of the photoresist layer serve as a masking structure 406. The portions of TEOS layer 402 exposed by openings 404 are anisotropically etched. Silicon nitride layer 366 serves as an etch stop layer. Masking structure 406 is removed and another layer of photoresist is formed on the exposed portions of silicon nitride layer 366 and on TEOS layer 402. The photoresist layer is patterned to have openings that expose portions of silicon nitride layer 366 over conductors 352 and 354. The exposed portions of silicon nitride layer 366 are anisotropically etched to expose conductors 352 and 354. The layer of photoresist is removed.

Figure 35:
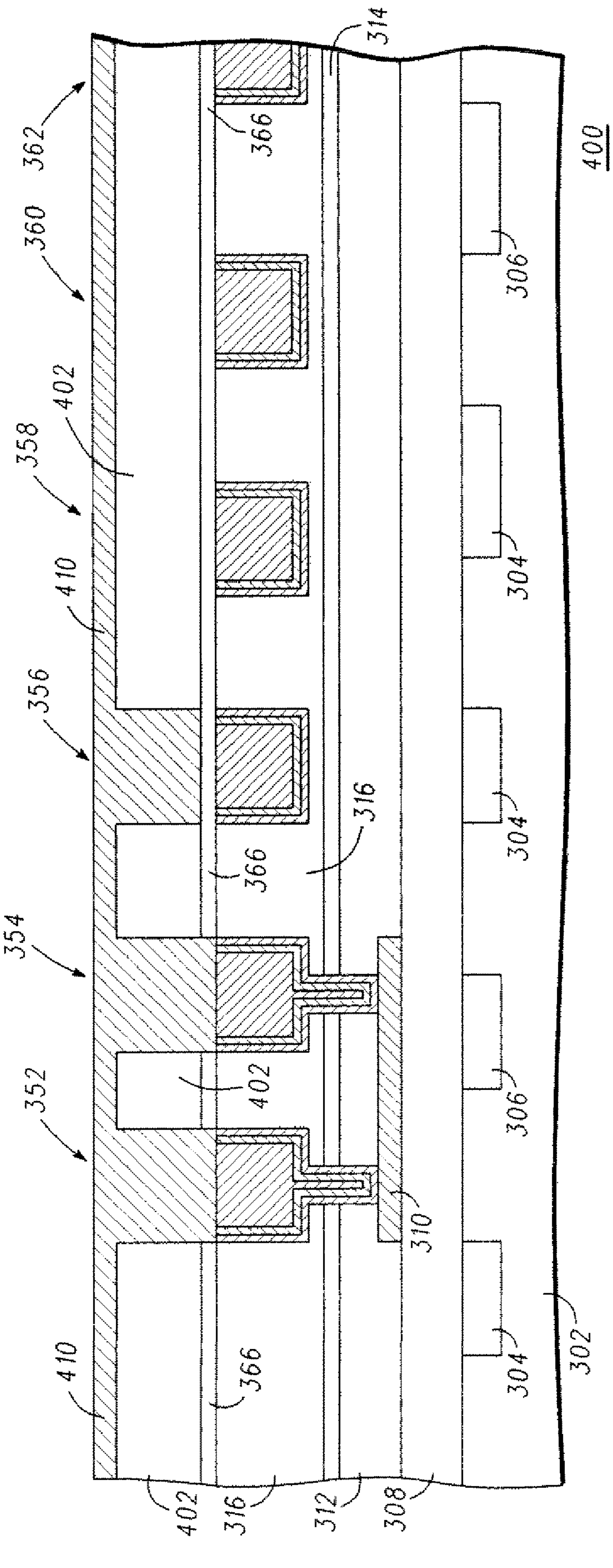
FIG. 35 is a cross-sectional view of the semiconductor component of FIG. 34 at a later stage of manufacture.

Referring now to FIG. 35, a layer of conductive material 410 such as, for example, aluminum is formed over TEOS layer 402, conductors 352 and 354, and silicon nitride layer 366.

Figure 36:
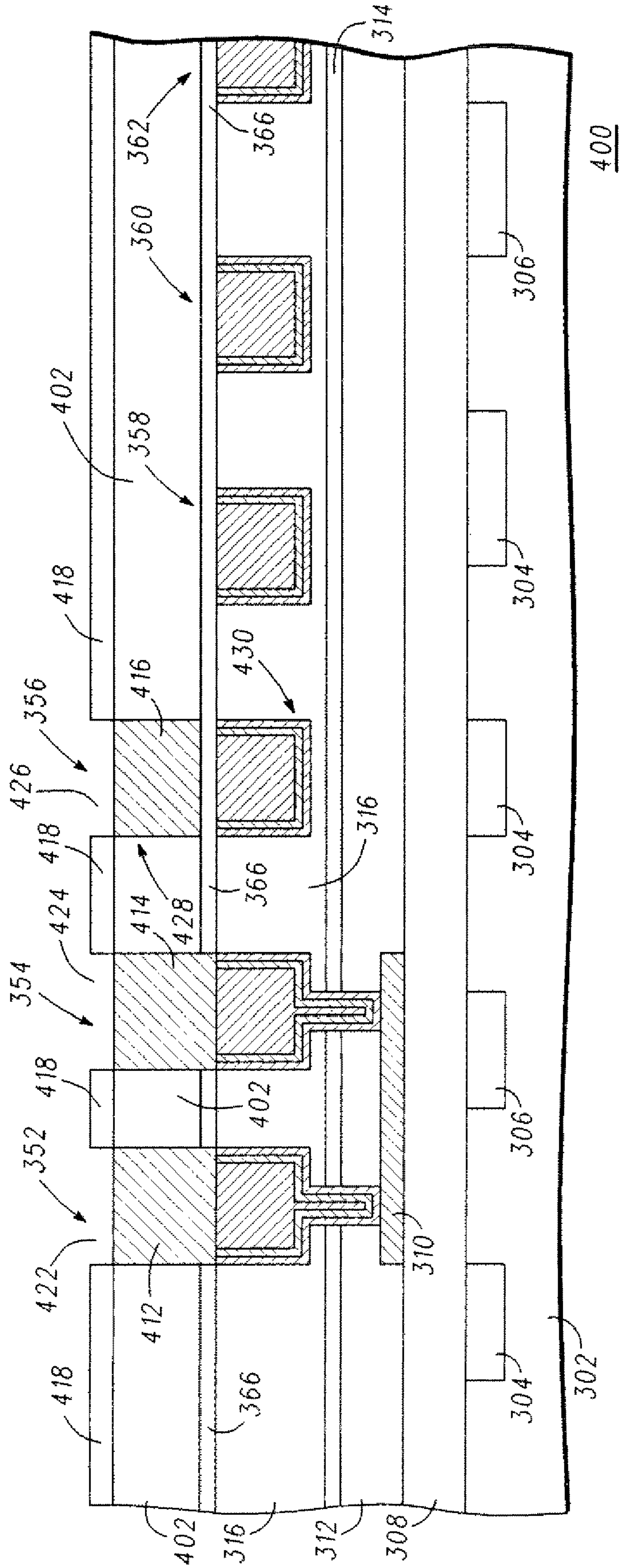
FIG. 36 is a cross-sectional view of the semiconductor component of FIG. 35 at a later stage of manufacture.

Referring now to FIG. 36, aluminum layer 410 is planarized using, for example, CMP leaving conductor 412 in contact with conductor 352, conductor 414 in contact with conductor 354, and conductor 416 over a portion of silicon nitride layer 366. A passivation layer 418 is formed over TEOS layer 402 and conductors 412, 414, and 416. Openings 422, 424, and 426 are formed in passivation layer 418 to expose conductors 412, 414, and 416, respectively. Conductor 356 serves as a portion of an inductor 428 and as a plate of a capacitor 430. Conductor 416 serves as the other plate of capacitor 430.

Figure 37:
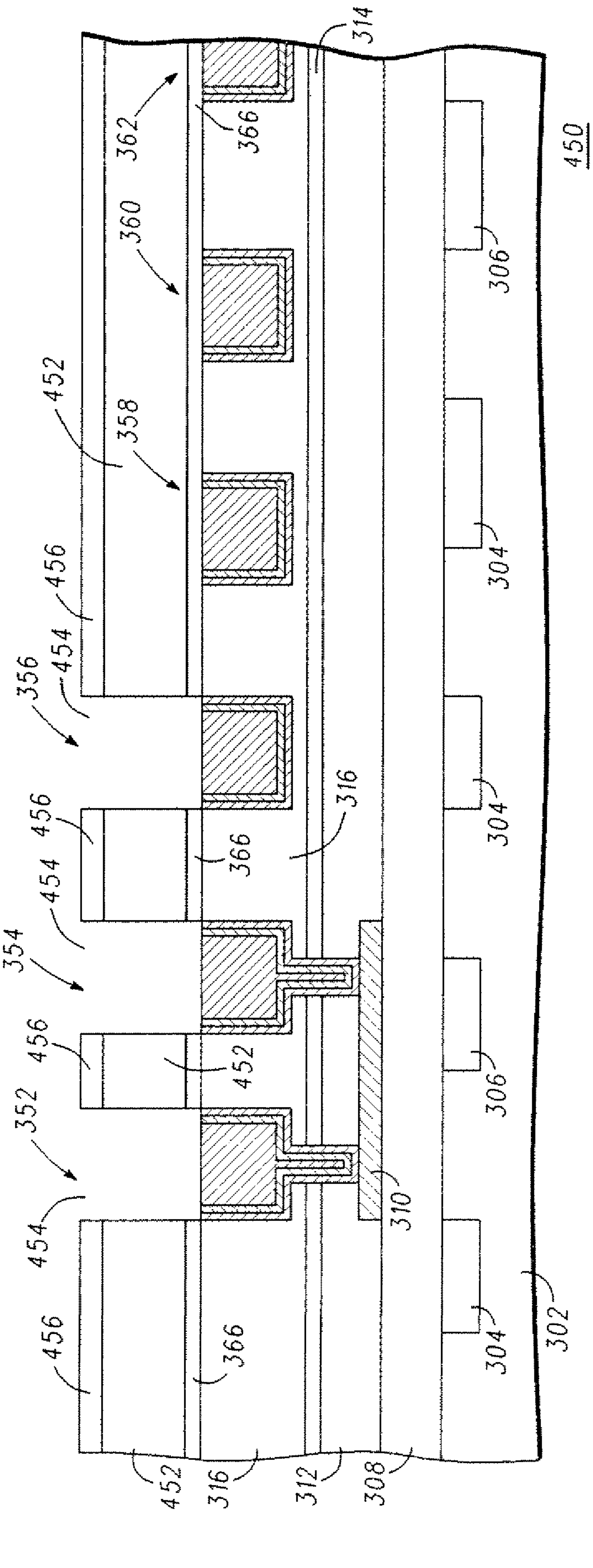
FIG. 37 is a cross-sectional view of a semiconductor component at a beginning stage of manufacture in accordance with another embodiment of the present invention.

FIG. 37 is a cross-sectional view of a semiconductor component 450 during manufacture in accordance with another embodiment of the present invention. It should be noted that the manufacturing steps described with reference to FIGS. 22-26 also apply to the manufacture of semiconductor component 450, except that the photoresist layer has a different pattern formed in it. Thus, the description of FIG. 37 continues from the description of FIG. 26 with reference number 300 in FIG. 26 being replaced by reference number 450. It should be noted that openings 368 and masking structure 370 are not formed in the embodiment described with reference to FIG. 37.

A layer of dielectric material 452 having a thickness ranging from about 1,000 Å to about 5,000 Å is formed over silicon nitride layer 366. Preferably the dielectric material of layer 402 is TEOS. A layer of photoresist is formed on TEOS layer 452 and patterned to have openings 454 that expose portions of TEOS layer 452. The remaining portions of the photoresist layer serve as a masking structure 456. The portions of TEOS layer 452 exposed by openings 452 are anisotropically etched. Silicon nitride layer 366 serves as an etch stop layer. Then the exposed portions of silicon nitride layer 366 are anisotropically etched to expose electrodes 352, 354, and 356.

Figure 38:
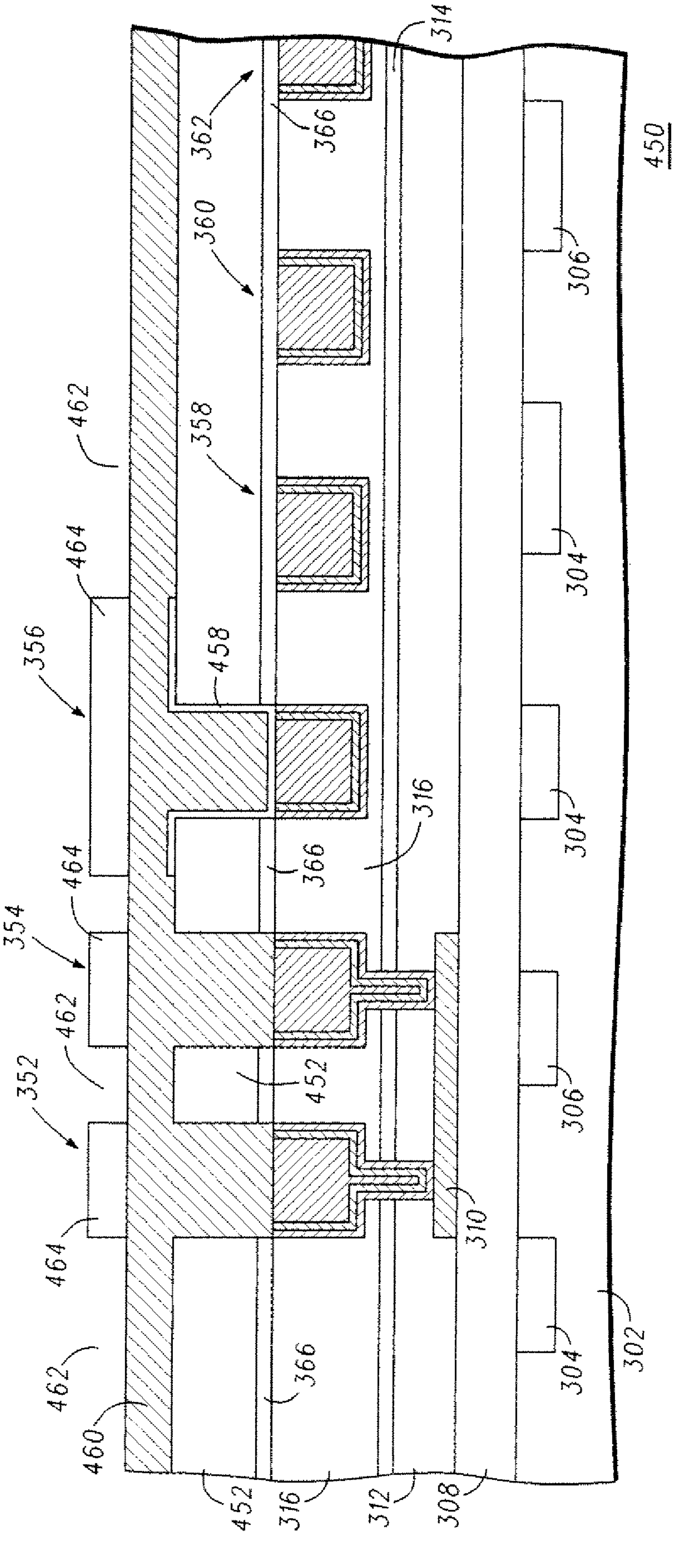
FIG. 38 is a cross-sectional view of the semiconductor component of FIG. 37 at a later stage of manufacture.

Referring now to FIG. 38, masking structure 456 is removed and a layer of dielectric material having a thickness ranging from about 400 Å to about 2,500 Å is formed on TEOS layer 452 and on conductors 352, 354, and 356. By way of example, the material for the dielectric layer is silicon nitride. A layer of photoresist is formed on the silicon nitride layer and patterned to form a masking structure. The portions of the silicon nitride layer unprotected by masking structure are anisotropically etched leaving a dielectric layer 458 over conductor 356 and portions of TEOS layer 452 laterally adjacent conductor 356.

A layer of conductive material 460 such as, for example, aluminum is formed on TEOS layer 452, conductors 352 and 354, and on dielectric layer 458.

A layer of photoresist is formed on aluminum layer 460 and patterned to have openings 462 that expose portions of aluminum layer 460. The remaining portions of the photoresist layer serve as a masking structure 464.

Figure 39:
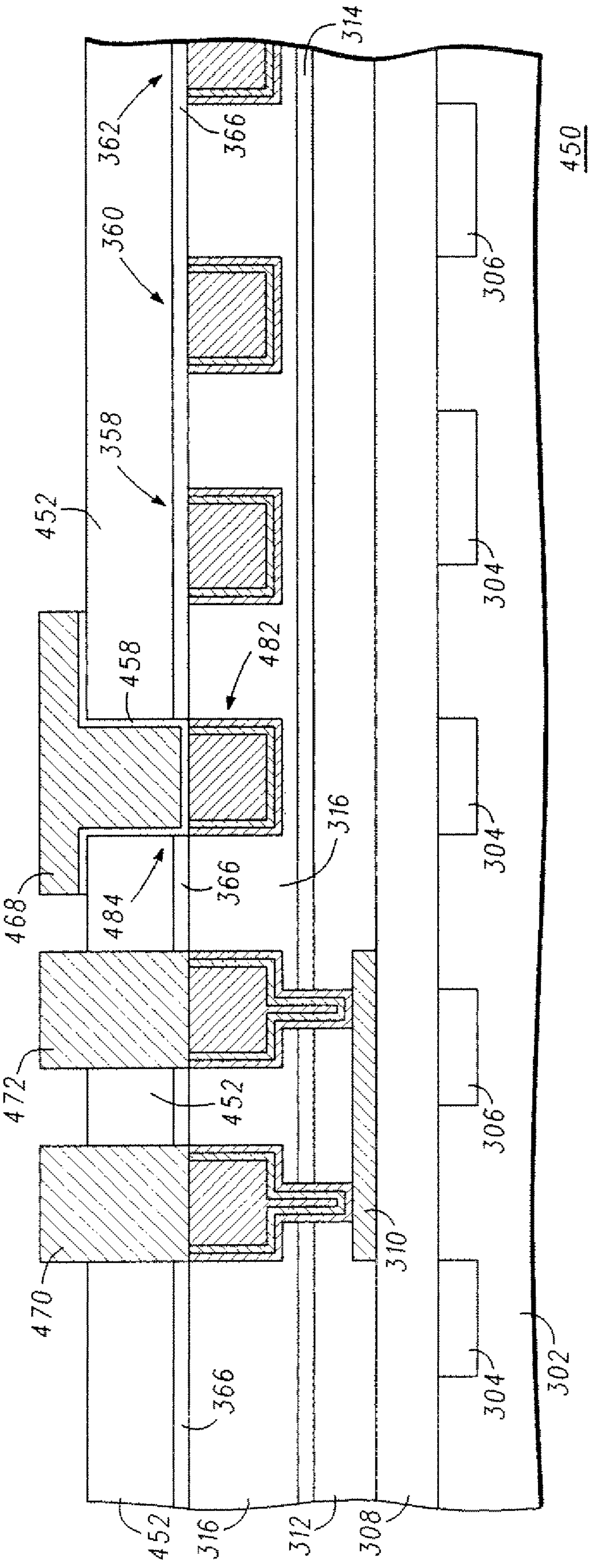
FIG. 39 is a cross-sectional view of the semiconductor component of FIG. 38 at a later stage of manufacture.

Referring now to FIG. 39, the exposed portions of aluminum layer 460 are anisotropically etched to expose portions of TEOS layer 452. A portion 468 of aluminum layer 460 remains over silicon nitride layer 458, a portion 470 remains over conductor 352, and a portion 472 remains over conductor 354. Conductor 356 serves as a portion of an inductor 482 and as a plate of a capacitor 484. Conductor 468 serves as the other plate of capacitor 484. Thus, conductor 356 is a conductor of the capacitor at the same vertical circuit level as the inductor and is common to the capacitor and the inductor. Masking structure 464 is removed.

Figure 40:
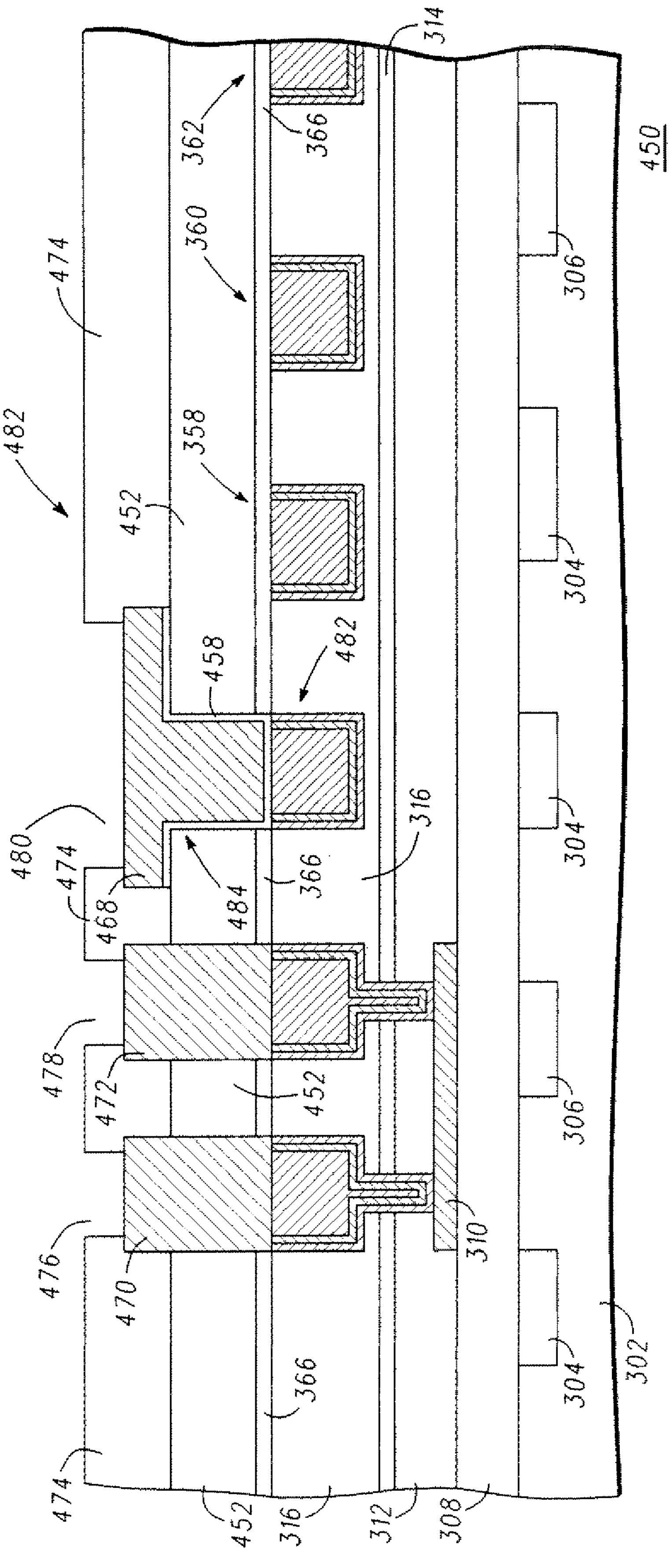
FIG. 40 is a cross-sectional view of the semiconductor component of FIG. 39 at a later stage of manufacture.

Referring now to FIG. 40, a passivation layer 474 is formed over TEOS layer 452 and conductors 470, 472, and 468. Openings 476, 478, and 480 are formed in passivation layer 418 to expose conductors 470, 472, and 468, respectively.

By now it should be appreciated that semiconductor component comprising an integrated passive device and a method for manufacturing the semiconductor component have been provided. Manufacturing the integrated passive devices in accordance with the present invention allows using processing techniques that are compatible with the manufacture of high performance semiconductor devices, e.g., single and dual damascene processing techniques. In addition, the density of devices manufactured in a single semiconductor chip can be increased because integrated passive devices are vertically integrated. Advantageously, the present invention allows vertically integrating integrated passive devices directly over active devices without degrading the performance of the active devices. Thus, the present invention provides a method and structure for forming passive devices over active devices or active areas of a semiconductor chip.

Although certain preferred embodiments and methods have been disclosed herein, it will be apparent from the foregoing disclosure to those skilled in the art that variations and modifications of such embodiments and methods may be made without departing from the spirit and scope of the invention. For example, the resistor may be manufactured in a level that is above those of the capacitor and the inductor or the resistor may be manufactured in the same level as the active device. In addition, the capacitor is not limited to being a MIM structure. It is intended that the invention shall be limited only to the extent required by the appended claims and the rules and principles of applicable law.

What is claimed is:

1. A method for manufacturing a semiconductor component, comprising:

providing a substrate having a resistivity ranging from about 1,000 Ohm-centimeters to about 10,000 Ohm-centimeters;

forming a layer of dielectric material over the substrate, the layer of dielectric material having a thickness of at least 30,000 Angstroms;

forming a first passive circuit element at a first level above the substrate and above the layer of dielectric material; and forming a second passive circuit element at a second level above the first level, wherein at least one of the first or second passive circuit elements comprises a damascene structure.

2. The method of claim 1, wherein providing the substrate includes forming a third passive circuit element from or above the substrate.

3. The method of claim 2, wherein forming the first passive circuit element includes forming a capacitor;

forming the second passive circuit element includes forming an inductor; and forming the third passive circuit element includes forming a resistor.

4. The method of claim 3, wherein forming the capacitor includes:

forming a first layer of conductive material over the first layer of dielectric material, the first layer of conductive material comprising aluminum and having first and second portions;

forming a second layer dielectric material over the first layer of conductive material; and forming a second layer of conductive material over the second layer of dielectric material, the second layer of conductive material comprising aluminum.

5. The method of claim 4, wherein forming the inductor includes:

forming a third layer of dielectric material over the second layer of conductive material;

forming at least one damascene opening in the third layer of dielectric material; and forming copper in the at least one damascene opening.

6. The method of claim 5, wherein forming the copper in the at least one damascene opening includes forming a barrier layer in the at least one damascene layer before forming the copper in the at least one damascene opening, wherein the copper, the barrier layer, and the at least one damascene opening cooperate to form the damascene structure.

7. The method of claim 5, wherein forming the at least one damascene opening includes:

forming a fourth layer of dielectric material on the third layer of dielectric material;

forming a first portion of the at least one damascene opening in the third layer of dielectric material; and forming a second portion of the at least one damascene opening in the fourth layer of dielectric material, wherein the second portion of the at least one damascene opening exposes a portion of the second layer of conductive material.

8. The method of claim 7, further including:

forming an active device from the substrate;

forming an opening in the first layer of dielectric material, the opening exposing the active device;

forming an electrical conductor in the opening;

forming the second portion of the first layer of conductive material on the conductor;

electrically isolating the first portion of the first layer of conductive material from the second portion of the first layer of conductive material; and forming a trench through the second, third and fourth layers of dielectric material, the trench exposing the second portion of the first layer of conductive material.

9. The method of claim 8, further including forming a conductive material in the trench.

10. The method of claim 9, wherein forming the conductive material in the trench includes forming copper in the trench.

11. The method of claim 10, further including forming aluminum over the copper in the trench.

12. A method for manufacturing a semiconductor component, comprising:

providing a substrate having a resistivity ranging from about 1,000 Ohm-centimeters to about 10,000 Ohm-centimeters;

forming a layer of dielectric material over the substrate, the layer of dielectric material having a thickness of at least 30,000 Angstroms;

forming an inductor using a damascene process, the inductor formed in a first vertical planar region; and forming a capacitor in a second vertical planar region, the capacitor having a first conductor separated from a second conductor by a dielectric material that is over the layer of dielectric material.

13. The method of claim 12, wherein the first vertical planar region is above the second vertical planar region.

* * * * *